(12) United States Patent
Yamashita et al.

(10) Patent No.: US 7,928,480 B2
(45) Date of Patent: Apr. 19, 2011

(54) SEMICONDUCTOR DEVICE

(75) Inventors: Masaharu Yamashita, Tenri (JP); John Kevin Twynam, Yamatokooriyama (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 192 days.

(21) Appl. No.: 11/606,090

(22) Filed: Nov. 30, 2006

(65) Prior Publication Data

US 2007/0152239 A1    Jul. 5, 2007

(30) Foreign Application Priority Data

Dec. 1, 2005 (JP) ............... P2005-347587
Nov. 17, 2006 (JP) ............... P2006-311707

(51) Int. Cl.
*H01L 33/00* (2010.01)

(52) U.S. Cl. ........ 257/280; 257/284; 257/471; 257/281; 257/282; 257/283; 257/E31.066; 257/E31.074; 257/E27.068; 257/E29.041; 257/E29.148; 257/E21.186; 257/E21.374; 257/E21.45; 257/E21.458

(58) Field of Classification Search .......... 257/129, 257/168, 192, 199, 213, 339, 356, 367, 409, 257/471, 481, 483, 487, E21.047, E21.064, 257/E21.186, E21.374, E29.023, E29.041, 257/E29.148, E29.178, E9.271, E29.311, 257/E31.074, 280–284, 187, 453, 267, 449, 257/473, E51.009, E33.051, E31.066, E27.068, 257/E29.317, E21.45, E21.458; 438/167, 270, 271

See application file for complete search history.

(56) References Cited

U.S. PATENT DOCUMENTS

| | | | | |
|---|---|---|---|---|
| 5,548,144 A * | 8/1996 | Kohno | ............... | 257/284 |
| 5,698,888 A * | 12/1997 | Fukaishi | ............... | 257/420 |
| 7,183,592 B2 * | 2/2007 | Hwang | ............... | 257/194 |
| 2002/0079525 A1 | 6/2002 | Mayazumi | | |
| 2004/0164374 A1 | 8/2004 | Ishikura | | |
| 2004/0211976 A1 * | 10/2004 | Twynam | ............... | 257/192 |

FOREIGN PATENT DOCUMENTS

| | | |
|---|---|---|
| JP | 10-335637 | 12/1998 |
| JP | 2002-198443 A | 7/2002 |
| JP | 2004-253620 A | 9/2004 |

* cited by examiner

*Primary Examiner* — David Vu
*Assistant Examiner* — Suberr Chi
(74) *Attorney, Agent, or Firm* — Birch, Stewart, Kolasch & Birch, LLP

(57) ABSTRACT

A semiconductor device has a semiconductor layer, and a first electrode (Schottky electrode or MIS electrode) and a second electrode (ohmic electrode) which are formed on the semiconductor layer apart from each other. The first electrode has a cross section in the shape of a polygon. A second electrode-side corner of the polygon has an interior angle of which an outward extension line of a bisector crosses the semiconductor layer or the second electrode. The interior angle of such a second electrode-side corner is larger than 90°.

11 Claims, 17 Drawing Sheets

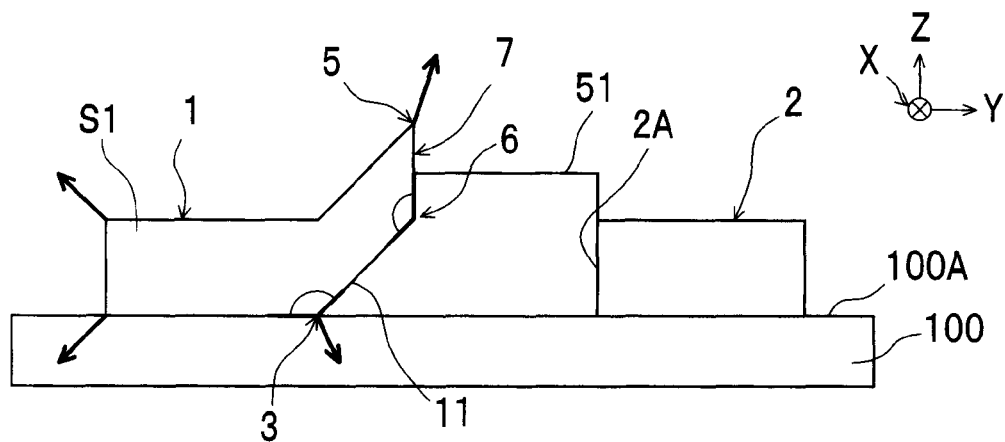
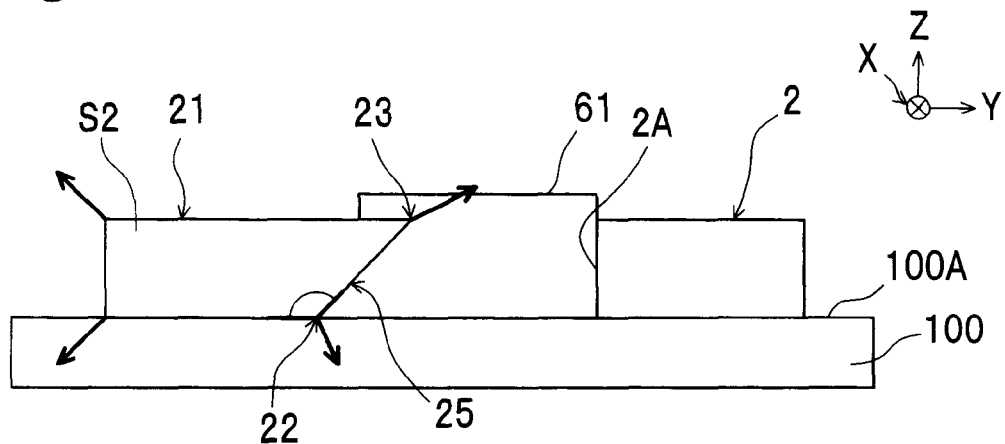
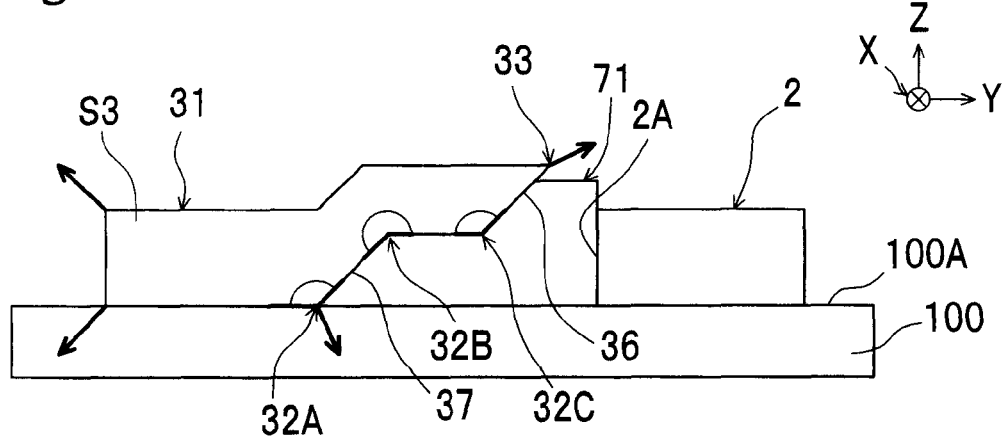

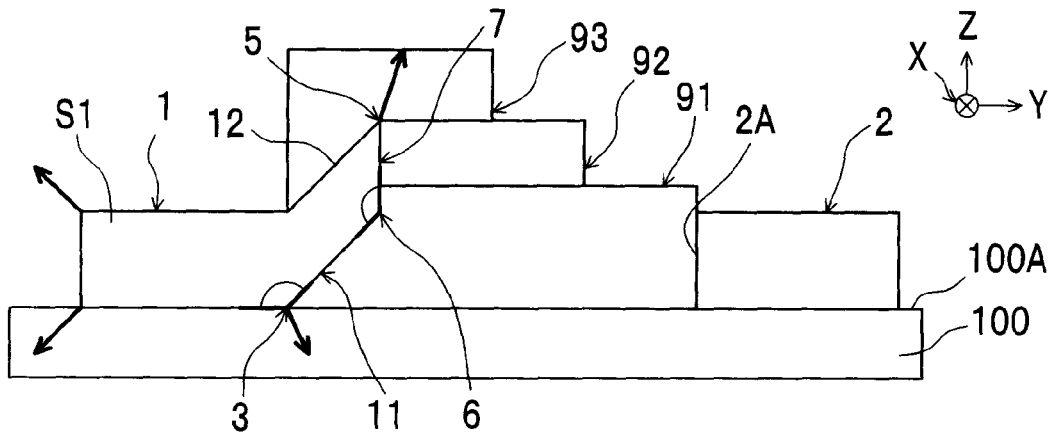
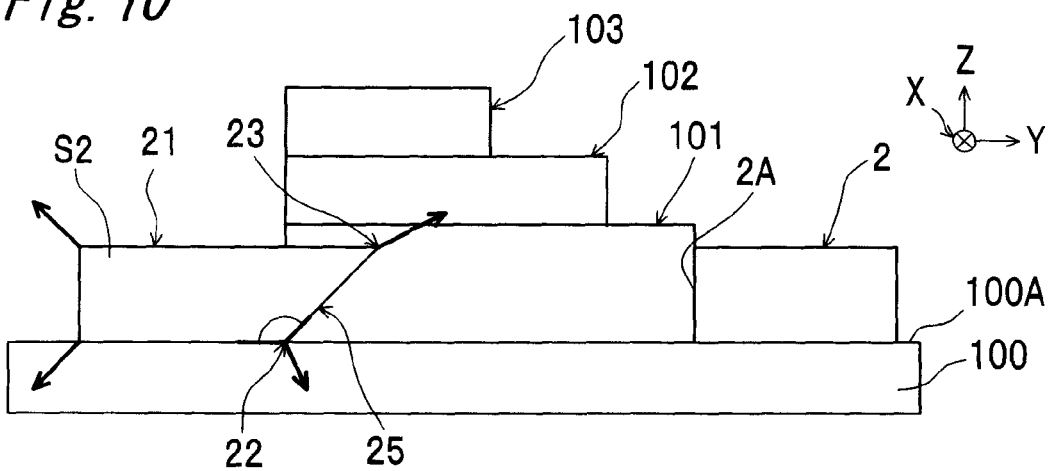
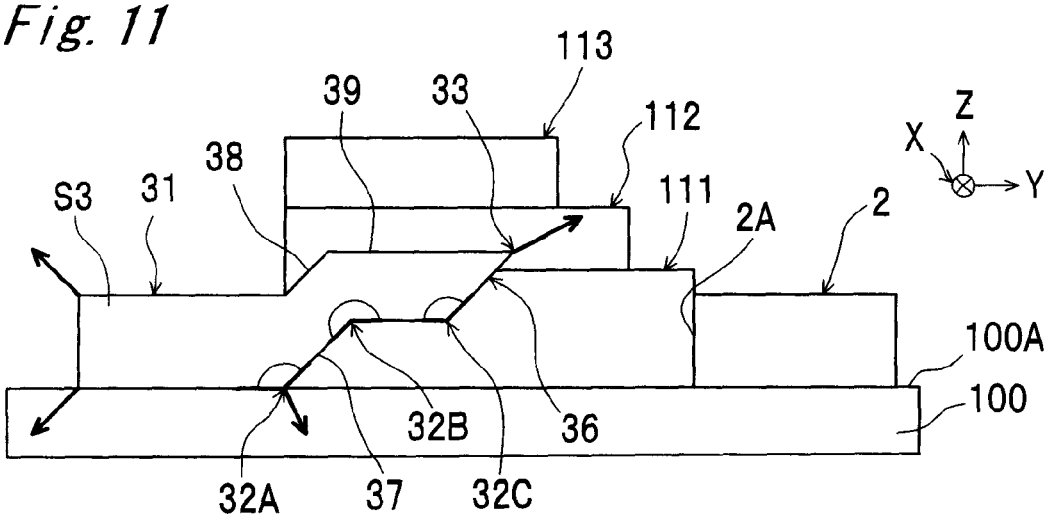

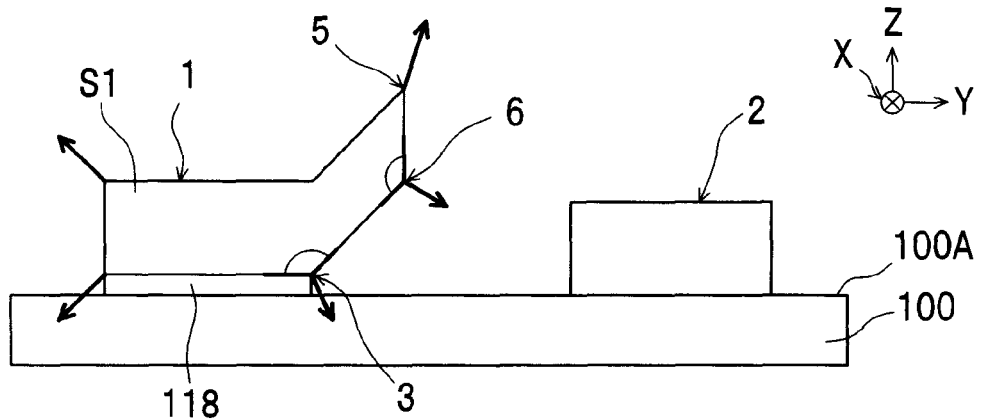
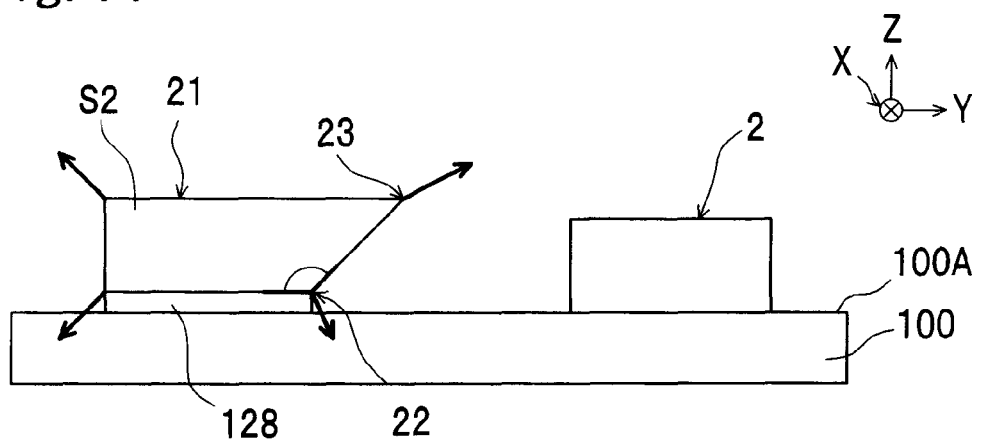
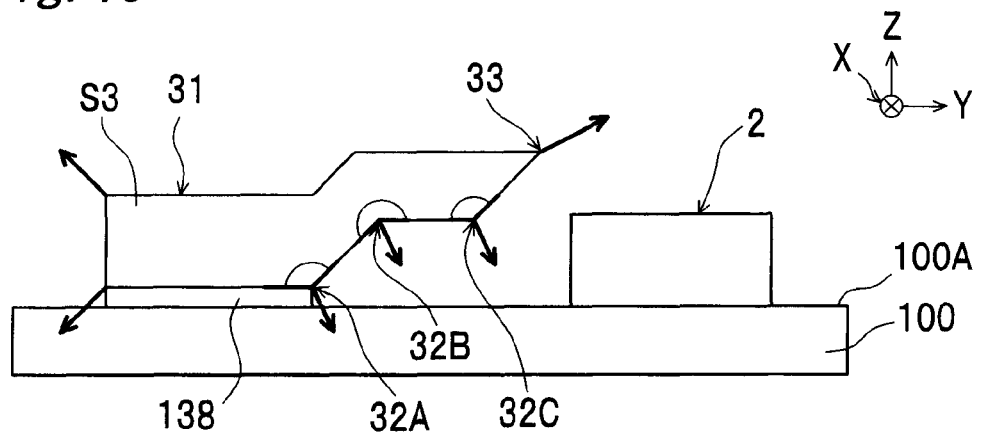

SEMICONDUCTOR DEVICE

This nonprovisional application claims priority under 35 U.S.C. §119(a) on Patent Application Nos. 2005-347537 and 2006-311707 filed in Japan on Dec. 1, 2005 and Nov. 17, 2006, respectively, the entire contents of which are hereby incorporated by reference.

BACKGROUND OF THE INVENTION

The present invention relates to a semiconductor device having an increased breakdown voltage between electrodes.

Semiconductor devices in which a Schottky electrode and an ohmic electrode are formed on a semiconductor layer have been required to have an increased breakdown voltage between electrodes.

SUMMARY OF THE INVENTION

It is therefore an object of the present invention to provide a semiconductor device having an increased breakdown voltage between electrodes.

In order to accomplish the object, a semiconductor device according to the present invention includes a semiconductor layer; a non-ohmic first electrode formed on the semiconductor layer; and an ohmic second electrode formed on the semiconductor layer apart from the first electrode, wherein the second electrode has a linear edge that faces the first electrode and is in contact with the semiconductor layer and, assuming that a direction in which the linear edge of the second electrode extends is a first direction, that a direction which is a direction of thickness of the semiconductor layer and is orthogonal to the first direction is a second direction, and that a direction orthogonal to the first and second directions is a third direction, a cross section of the first electrode taken along a plane extending in the second and third directions has a shape of a polygon, and a second electrode-side corner of the polygon has an interior angle of which an outward extension line of a bisector crosses the semiconductor layer or the second electrode and which is larger than 90°.

In the semiconductor device according to the present invention, the interior angle of the second electrode (ohmic electrode)-side corner of the first electrode (non-ohmic electrode) is larger than 90°. Because of this, it is possible to prevent an electric field between the first electrode and the second electrode from concentrating at that corner of the first electrode, whereby the breakdown voltage between the electrodes can be increased.

In one embodiment, the first electrode is a Schottky electrode or a metal insulator semiconductor ("MIS") electrode.

In the semiconductor device of this embodiment, electric field concentration on the Schottky electrode or MIS electrode, on which electric fields readily concentrate, is mitigated so that the breakdown voltage between the electrodes is increased.

In one embodiment, the semiconductor device further includes a high dielectric film which covers a corner portion of the first electrode defining the corner of the polygon having the interior angle of larger than 90°, the high dielectric film having a higher dielectric constant than the semiconductor layer.

In the semiconductor device of this embodiment, the high dielectric film covers the corner portion, so that electric field concentration on the corner portion of the first electrode can be more mitigated, thereby further increasing the breakdown voltage between the electrodes.

In one embodiment, when the corner having the interior angle of larger than 90° of the polygon of the first electrode is defined as a first corner, the polygon has a second corner on the second electrode side, the second corner having an interior angle of which an outward extension line of a bisector crosses neither the second electrode nor the semiconductor layer, and the second corner is more distant from the semiconductor layer than the first corner is.

In the semiconductor device of this embodiment, the outward extension line of the bisector of the interior angle of the second corner does not cross the second electrode or the semiconductor layer. Therefore, even if the interior angle is an acute angle, electric fields between the first electrode and the second electrode do not readily concentrate at the second corner. That is, electric field concentration at the second corner is suppressed. Therefore, reducing the breakdown voltage between the electrodes is avoided and the breakdown voltage performance is improved.

In one embodiment, the interior angle of the second corner is 90° or less.

In the semiconductor device of this embodiment, the outward extension line of the bisector of the interior angle of the second corner does not cross the second electrode or the semiconductor layer. Therefore, although the interior angle is an acute angle, electric fields between the first electrode and the second electrode do not easily concentrate at the second corner.

In one embodiment, the interior angle of the second corner is larger than 90°.

In the semiconductor device of this embodiment, not only does the outward extension line of the bisector of the interior angle of the second corner cross neither the second electrode nor the semiconductor layer, but the interior angle of the second corner is larger than 90°. Therefore, electric fields between the first electrode and the second electrode do not easily concentrate at the second corner.

In one embodiment, the semiconductor device further includes a high dielectric film which covers a first corner portion defining the first corner of the first electrode and a second corner portion defining the second corner of the first electrode, the high dielectric film having a higher dielectric constant than the semiconductor layer.

In the semiconductor device of this embodiment, because the high dielectric film covers the first and second corner portions, electric field concentration on these corner portions of the first electrode can be more mitigated, whereby the breakdown voltage between the electrodes can be further increased.

In one embodiment, the interior angle of the second corner is an acute angle, and the polygon of the first electrode has a plurality of first corners.

In the semiconductor device of this embodiment, provision of the plurality of first corners contributes to the mitigation of the electric field concentration on the second electrode side, thereby increasing the breakdown voltage between the electrodes.

In one embodiment, the semiconductor device further has a high dielectric film which covers a plurality of first corner portions defining the plurality of first corners, the high dielectric film having a higher dielectric constant than the semiconductor layer.

In the semiconductor device of this embodiment, because the high dielectric film covers the corner portions, electric field concentration on the corner portions of the first electrode can be more mitigated, so that the breakdown voltage between the electrodes is increased.

In one embodiment, the interior angle of the second angle is an acute angle and the polygon of the first electrode further has a third corner adjacent to both the first corner and the second corner. The third corner has an interior angle of which an outward extension line of a bisector crosses at least one of the second electrode or the semiconductor layer, the interior angle of the third corner being larger than 90°. Also, the polygon of the first electrode has a vertical side which extends from the third corner to the second corner and which is perpendicular to a top surface of the semiconductor layer. The wording "perpendicular to a top surface of the semiconductor layer" should be interpreted as including not only a case of being "accurately perpendicular to a top surface of the semiconductor layer" but also a case of being "virtually perpendicular to a top surface of the semiconductor layer" that is regarded as equivalent to "perpendicular".

In this embodiment, because the vertical side extending from the third corner to the second corner is perpendicular to the top surface of the semiconductor layer, electric field concentration on the corner portions of the first electrode can be mitigated, whereby the breakdown voltage between the electrodes can be further increased.

In one embodiment, the semiconductor device further has a high dielectric film which covers a first corner portion of the first electrode defining the first corner and a third corner portion of the first electrode defining the third corner, the high dielectric film having a higher dielectric constant than the semiconductor layer.

In this embodiment, because the high dielectric film covers the first and third corner portions, electric field concentration on these corner portions of the first electrode can be more mitigated, whereby the breakdown voltage between the electrodes can be further increased.

In one embodiment, the semiconductor device further has a high dielectric film which covers a first corner portion of the first electrode defining the first corner, a second corner portion of the first electrode defining the second corner, and a third corner portion of the first electrode defining the third corner, the high dielectric film having a higher dielectric constant than the semiconductor layer.

In this embodiment, because the high dielectric film covers the first through third corner portions, electric field concentration on these corner portions of the first electrode can be more mitigated, whereby the breakdown voltage between the electrodes can be further increased.

In one embodiment, the semiconductor device is a field-effect transistor in which the first electrode is a gate electrode and the second electrode is a source electrode or a drain electrode.

The field-effect transistor according to this embodiment has an increased breakdown voltage between the gate electrode and the source/drain electrode.

In one embodiment, the semiconductor device is a GaN-based heterojunction field-effect transistor. This field-effect transistor has an increased breakdown voltage between the gate electrode and the source/drain electrode.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 5 is a partial cross-sectional view of a Schottky gate field-effect transistor as a fifth embodiment of the semiconductor device according to the present invention, showing electrode areas of the transistor;

FIG. 6 is a partial cross-sectional view of a Schottky gate field-effect transistor as a sixth embodiment of the semiconductor device according to the present invention, showing electrode areas of the transistor;

FIG. 7 is a partial cross-sectional view of a Schottky gate field-effect transistor as a seventh embodiment of the semiconductor device according to the present invention, showing electrode areas of the transistor;

FIG. 9 is a partial cross-sectional view of a Schottky gate field-effect transistor as a ninth embodiment of the semiconductor device according to the present invention, showing electrode areas of the transistor;

FIG. 10 is a partial cross-sectional view of a Schottky gate field-effect transistor as a tenth embodiment of the semiconductor device according to the present invention, showing electrode areas of the transistor;

FIG. 11 is a partial cross-sectional view of a Schottky gate field-effect transistor as an eleventh embodiment of the semiconductor device according to the present invention, showing electrode areas of the transistor;

FIG. 13 is a partial cross-sectional view of a field-effect transistor of MIS electrode structure as a thirteenth embodiment of the semiconductor device according to the present invention, showing electrode areas of the transistor;

FIG. 14 is a partial cross-sectional view of a field-effect transistor of MIS electrode structure as a fourteenth embodiment of the semiconductor device according to the present invention, showing electrode areas of the transistor;

FIG. 15 is a partial cross-sectional view of a field-effect transistor of MIS electrode structure as a fifteenth embodiment of the semiconductor device according to the present invention, showing electrode areas of the transistor;

DETAILED DESCRIPTION OF THE INVENTION

The present invention will be described in detail below with reference to embodiments shown in the figures.

First Embodiment

Figure 1:
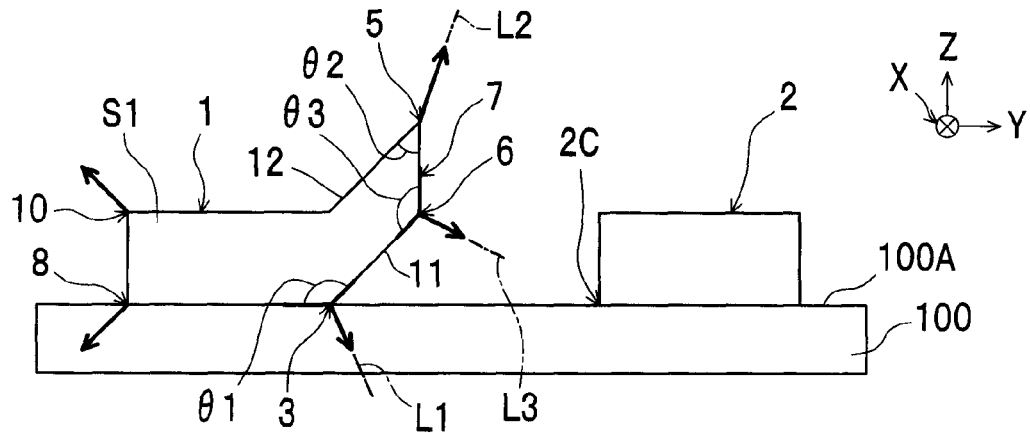
FIG. 1 is a partial cross-sectional view of a Schottky gate field-effect transistor as a first embodiment of the semiconductor device according to the present invention, showing electrode areas of the transistor.

FIG. 1 is a partial cross-sectional view of a Schottky gate field-effect transistor as a first embodiment of the semiconductor device according to the present invention, showing electrode areas of the transistor.

The first embodiment transistor has a semiconductor layer 100, a gate electrode 1, as the first electrode, which is a Schottky electrode formed on a surface 100A of the semiconductor layer 100, and a drain electrode 2, as the second electrode, which is an ohmic electrode formed on the surface 100A of the semiconductor layer 100. The gate electrode 1 and the drain electrode 2 are spaced from each other by a predetermined distance on the surface 100A of the semiconductor layer 100. Furthermore, on the surface 100A of the semiconductor layer 100, a source electrode (not shown) is provided at a predetermined distance from the gate electrode 1 on the side opposite from the drain electrode 2.

The distance from the first electrode to the second electrode is preferably 5 to 10 μm.

The gate electrode 1 may be a metal electrode formed of, for example, a WN (tungsten nitride)/Au film a Ti/Pt/Au film of which Pt is a main constituent, or a Ti/Au film. The drain electrode 2 and the source electrode may be metal electrodes formed by a laminated film of Ti/Al/Au as an example. The semiconductor layer 100 may be a III-V semiconductor layer such as a GaAs layer, an AlGaAs layer, a GaN layer, an AlGaN layer, a SiC layer, or the like.

As shown in FIG. 1, a linear edge 2C of the drain electrode 2 is opposed to the gate electrode 1 and is in contact with the semiconductor layer 100, and a direction in which the linear edge 2C extends is defined as an X-axis direction as the first direction (perpendicular to the paper face), a direction which is the direction of thickness of the semiconductor layer 100 and is orthogonal to the X-axis direction is defined as a Z-axis direction as the second direction, and a direction orthogonal to both of the X-axis and Z-axis is defined as a Y-axis direction as the third direction. It is noted that the direction of the X axis shown in the Figures is opposite to the normal convention, and is actually the negative X axis.

FIG. 1 shows a cross section (Y-Z section) of the first embodiment taken along a Y-Z plane extending in the Y-axis direction and Z-axis direction.

A polygon S1 which is the shape of the Y-Z section of the gate electrode 1 as the first electrode has a first corner 3, a second corner 5, and a third corner 6 on the drain electrode 2 side.

An outward extension line L1 of a bisector of the interior angle of the first corner 3 crosses the semiconductor layer 100, and a line image of the extension line L1 vertically projected onto the surface 100A of the semiconductor layer 100 extends between the gate electrode 1 and the drain electrode 2. The interior angle θ1 of the first corner 3 is larger than 90°, thus being an obtuse angle. As an example, the interior angle θ1 is between 120° and 150°, more specifically, for example, 135°.

An outward extension line L2 of a bisector of the interior angle of the second corner 5 does not cross the drain electrode 2 or the semiconductor layer 100. A line image of the extension line L2 vertically projected onto the surface 100A of the semiconductor layer 100 extends between the gate electrode 1 and the drain electrode 2. The interior angle θ2 of the second corner 5 is an acute angle, such as 45°. As shown in FIG. 1, the second corner 5 is away from the semiconductor layer 100.

The third corner 6 of the polygon S1 is adjacent to the first corner 3 and the second corner 5. An outward extension line L3 of a bisector of the interior angle θ3 of the third corner 6 crosses the semiconductor layer 100. A line image of the extension line L3 vertically projected onto the surface 100A of the semiconductor layer 100 also extends between the gate electrode 1 and the drain electrode 2. The interior angle θ3 of the third corner 6 is larger than 90°, thus being an obtuse angle. As an example, the interior angle θ3 is between 120° and 150°, more specifically, for example, 135°.

On the other hand, the shape of the Y-Z section of the drain electrode 2 as the second electrode is a rectangle. The shape of the Y-Z section of the drain electrode 2 may be a square or any other polygon. In the first embodiment, the Y-Z section of the drain electrode 2 continues in about the same shape in the X-axis direction (perpendicular to the paper face).

As shown in FIG. 1, the polygon S1 has a vertical side 7 which extends from the third corner 6 to the second corner 5 and is perpendicular to the surface 100A of the semiconductor layer 100. The polygon S1 also has an oblique side 11 which extends from the first corner 3 to the third corner 6. The polygon S1 also has an oblique side 12 opposite to the oblique side 11.

In the first embodiment, the gate electrode 1 extends in the X-axis direction (perpendicular to the paper face) with its Y-Z sections substantially in the shape of the polygon S1. Thus, the first corner 3, second corner 5, and third corner 6 constitute a first corner portion, second corner portion, and third corner portion on the drain electrode 2 side of the gate electrode 1, respectively. Furthermore, the vertical side 7 of the polygon S1 constitutes a vertical surface on the drain electrode 2 side of the gate electrode 1, and the oblique side 11 constitutes an oblique surface on the drain electrode 2 side of the gate electrode 1.

In the first embodiment, the interior angle θ1 of the first corner 3 on the ohmic drain electrode 2 side of the Schottky gate electrode 1 is larger than 90°. Because of this, it is possible to suppress concentration of electric fields between the gate electrode 1 and the drain electrode 2 on the first corner 3 of the gate electrode 1, thereby increasing the breakdown voltage between the electrodes.

Furthermore, in the first embodiment, although the interior angle θ2 of the second corner 5 of the polygon S1 is an acute angle, the outward extension line L2 of the bisector of the interior angle θ2 does not cross the drain electrode 2 or the semiconductor layer 100, so that electric fields between the gate electrode 1 and the drain electrode 2 hardly concentrate at the second corner 5. Because of this, even if the gate electrode 1 has, on its drain electrode 2 side, the second corner 5 the interior angle θ2 of which is an acute angle, electric field concentration at the second corner 5 is suppressed, and therefore the decrease of the breakdown voltage between the electrodes is avoided. As a result, it is possible to improve the breakdown voltage performance.

Furthermore, in the first embodiment, the polygon S1 has the third corner 6 adjacent to the first corner 3 and the second corner 5, wherein like the first corner 3, the interior angle θ3 of the third corner 6 is an obtuse angle and the extension line L3 of the bisector of the interior angle θ3 reaches the semiconductor layer 100. The existence of two obtuse angle corner portions comprised of the third corner 6 and the first corner 3 can more mitigate electric field concentration on the drain electrode 2 side portion of the gate electrode 1 to further increase the breakdown voltage between the electrodes.

Furthermore, since the vertical side 7 which extends from the third corner 6 to the second corner 5 of the gate electrode 1 is perpendicular to the surface 100A of the semiconductor layer 100, concentration of electric fields between the gate electrode 1 and the drain electrode 2 at the corners 3, 5, and 6 of the gate electrode 1 can be more suppressed, whereby the breakdown voltage between the electrodes is further increasable.

In the first embodiment, the polygon S1 has two corners 8 and 10 on the source electrode (not shown) side, and the interior angles of the two corners 8 and 10 are right angles, but the source electrode (not shown) side shape of the polygon S1 may be similar to the drain electrode 2 side shape. Furthermore, the first embodiment semiconductor device may be a field-effect transistor (FET) using, for example, GaN-based semiconductors, GaAs-based semiconductors, or any other semiconductor. The first embodiment may be effectively applied in particular to a GaN heterojunction field-effect transistor for which a high gate breakdown voltage is particularly required.

(Breakdown Voltage Simulation 1)

Figure 32:
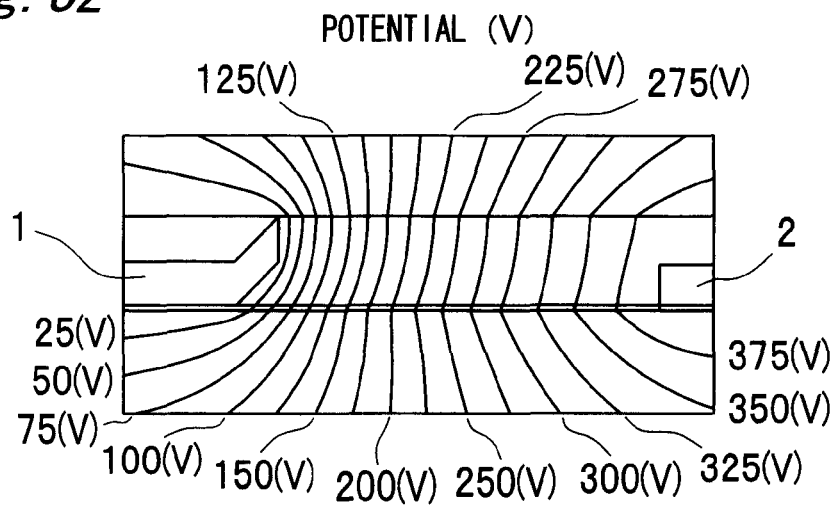
FIG. 32 shows a potential distribution obtained as a result of a breakdown voltage simulation of the first embodiment.

Simulations of breakdown voltages between a gate electrode 1 and a drain electrode 2 having structures equivalent to the gate electrode 1 and the drain electrode 2 of the first embodiment were performed. FIG. 32 shows a potential distribution as a result of a simulation wherein 400 (V) was applied between the gate electrode 1 and the drain electrode 2.

The shown breakdown voltage simulation result is an electric field distribution obtained just before a breakdown occurs as the result of increasing the voltage gradually. Simulations described below were implemented in similar ways.

Figure 34:
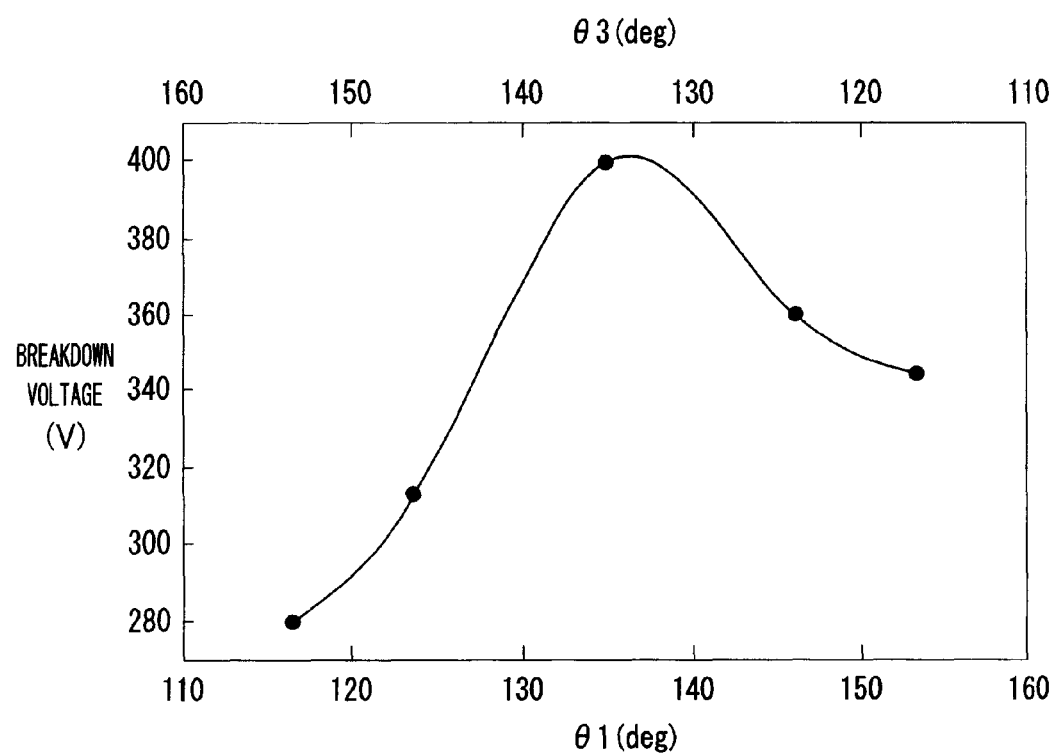
FIG. 34 shows a result of a test on the breakdown voltage between the electrodes of the first embodiment.

FIG. 34 shows variations of the breakdown voltage (V) between the electrodes 1 and 2 in the case that the interior angle θ1 of the first corner 3 and the interior angle θ3 of the third corner 6 of the gate electrode 1 of the first embodiment are increased or decreased from 135° when the sum (θ1+θ3) of the interior angles θ1 and θ3 is 270°. As shown in FIG. 34, when the interior angle θ1 and the interior angle θ3 are nearly equal, the breakdown voltage between the electrodes assumes a maximum or nearly maximum value, and the larger the difference between the interior angle θ1 and the interior angle θ3, the lower the breakdown voltage becomes.

Figure 35:
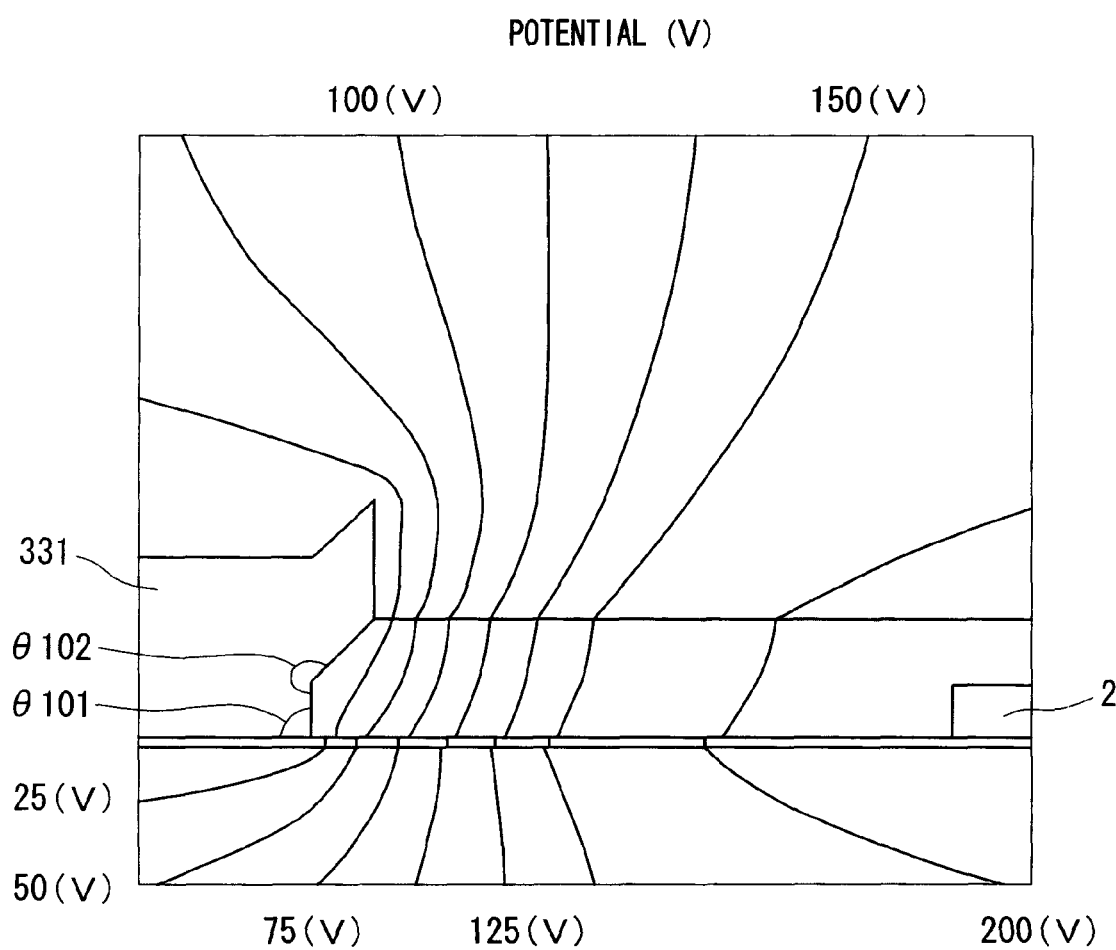
FIG. 35 shows a potential distribution obtained as a result of a breakdown voltage simulation of a semiconductor device having a structure disclosed in JP 10-335637 A.

Furthermore, breakdown voltage simulations were performed on a comparative example which has a gate electrode (Schottky electrode) 331 having a sectional shape, instead of the gate electrode 1, in which the interior angle θ101 of a corner being in contact with the semiconductor layer is 90°, and the interior angle θ102 of a corner adjacent to this 90° corner is larger than 90°. FIG. 35 shows a potential distribution as a result of a simulation in which 200 (V) was applied between the gate electrode 331 and the drain electrode 2 of this comparative example.

As is apparent from FIG. 32, in the structure of the gate electrode 1 of the first embodiment in which the interior angle θ1 of the first corner 3 is larger than 90°, so that electric field concentration at the corner 3 of the electrode 1 can be suppressed, as compared with the comparative example having the gate electrode 331 in which the interior angle θ101 of a corner being in contact with the semiconductor layer is 90° or less as shown in FIG. 35, thereby increasing the breakdown voltage between the electrodes.

Second Embodiment

Figure 2:
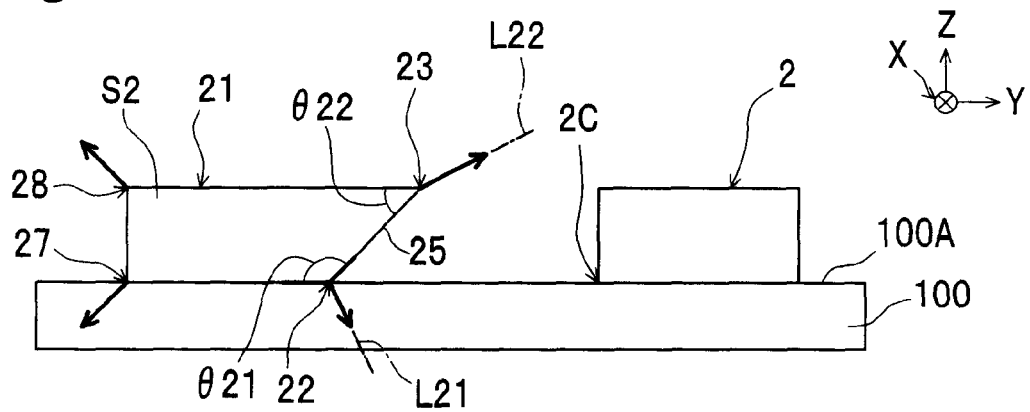
FIG. 2 is a partial cross-sectional view of a Schottky gate field-effect transistor as a second embodiment of the semiconductor device according to the present invention, showing electrode areas of the transistor.

FIG. 2 shows a partial cross-sectional view of a Schottky gate field-effect transistor as a second embodiment of the semiconductor device according to the present invention, showing electrode areas of the transistor.

The second embodiment is different from the first embodiment only in that a gate electrode 21 is provided instead of the gate electrode 1. In the second embodiment, parts same as or similar to the parts of the first embodiment are denoted by the same reference numerals or symbols as in the first embodiment to omit the description about them.

As shown in FIG. 2, the gate electrode 21 of the second embodiment has a section (Y-Z section) in the shape of a polygon S2 taken along a Y-Z plane. The polygon S2 has a first corner 22 and a second corner 23 on the drain electrode 2 side. The polygon S2 also has corners 27 and 28 the interior angles of which are substantially right angles on the side opposite to the drain electrode 2 side.

An outward extension line L21 of a bisector of the interior angle of the first corner 22 crosses the semiconductor layer 100, and a line image of the extension line L21 vertically projected onto the surface 100A of the semiconductor layer 100 extends between the gate electrode 21 and the drain electrode 2. The interior angle θ21 of the first corner 22 is larger than 90°, thus being an obtuse angle. As an example, the interior angle θ21 is between 120° and 150°, more specifically, for example, 135°

An outward extension line L22 of a bisector of the interior angle of the second corner 23 of the polygon S2 does not cross the drain electrode 2 or the semiconductor layer 100. A line image of the extension line L22 vertically projected onto the surface 100A of the semiconductor layer 100 extends between the gate electrode 21 and the drain electrode 2. The interior angle θ22 of the second corner 23 is an acute angle, such as 45°. As shown in FIG. 2, the second corner 23 is adjacent to the first corner 22 and away from the semiconductor layer 100.

As shown in FIG. 2, the polygon S2 has an oblique side 25 which extends from the first corner 22 to the second corner 23. In the second embodiment, the gate electrode 21 extends in the X-axis direction (perpendicular to the paper face) with its Y-Z sections substantially in the shape of the polygon S2. Thus, the first corner 22 and second corner 23 constitutes a first corner portion and second corner portion on the drain electrode 2 side of the gate electrode 21, respectively. Furthermore, the oblique side 25 of the polygon S2 constitutes an oblique surface on the drain electrode 2 side of the gate electrode 21.

In the second embodiment, the interior angle C21 of the first corner 22 on the ohmic drain electrode 2 side of the Schottky gate electrode 21 is larger than 90°. Because of this, it is possible to suppress concentration of electric fields between the gate electrode 21 and the drain electrode 2 on the first corner 22 of the gate electrode 21, thereby increasing the breakdown voltage between the electrodes.

Furthermore, in the second embodiment, although the interior angle θ22 of the second corner 23 of the polygon S2 is an acute angle, the outward extension line L22 of the bisector of the interior angle θ22 does not cross the drain electrode 2 or the semiconductor layer 100, so that electric fields between the gate electrode 21 and the drain electrode 2 hardly concentrate at the second corner 23. Because of this, even if the gate electrode 21 has, on its drain electrode 2 side, the second corner 23 the interior angle θ22 of which is an acute angle, electric field concentration at the second corner 23 is suppressed, and therefore the decrease of the breakdown voltage between the electrodes is avoided. As a result, it is possible to improve the breakdown voltage performance.

In the second embodiment, the polygon S2 has two corners 27 and 28 on the source electrode (not shown) side, and the interior angles of these two corners 27 and 28 are right angles, but the source electrode (not shown) side shape of the polygon S2 may be similar to the drain electrode 2 side shape.

(Breakdown Voltage Simulation 2)

Figure 31:
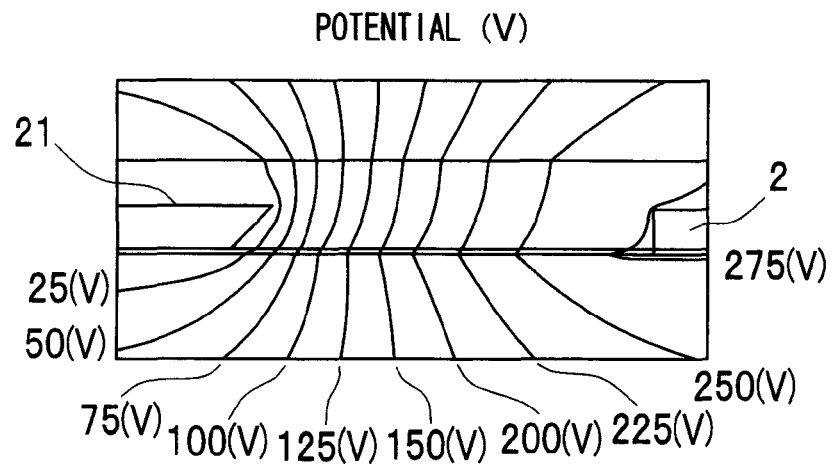
FIG. 31 shows a potential distribution obtained as a result of a breakdown voltage simulation of the second embodiment.

Simulations of breakdown voltages between a gate electrode 21 and a drain electrode 22 having structures equivalent to the gate electrode 21 and the drain electrode 2 of the second embodiment were performed. FIG. 31 shows a potential distribution as a result of a simulation wherein 280 (V) was applied between the gate electrode 21 and the drain electrode 2.

Figure 29:
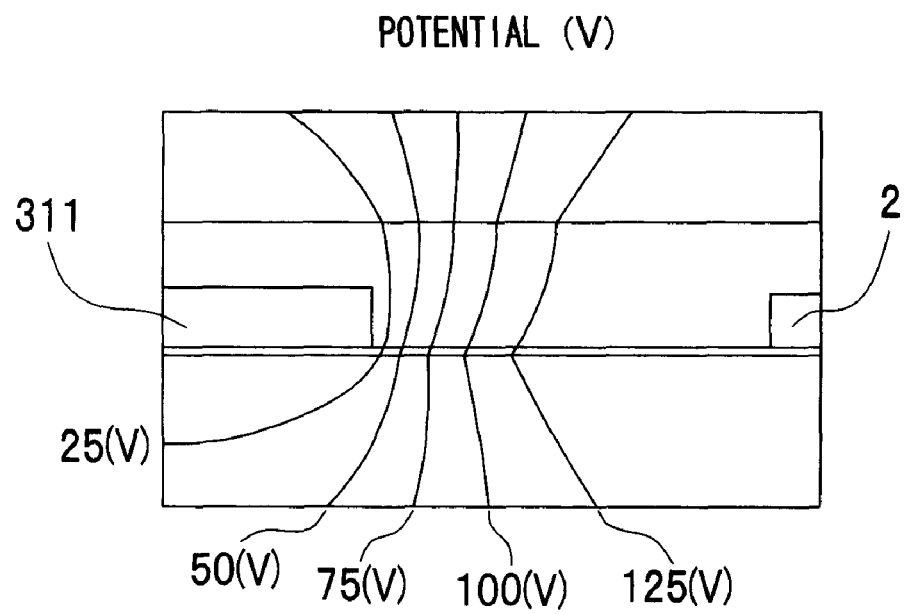
FIG. 29 shows a potential distribution obtained as a result of a breakdown voltage simulation of a comparative example of the second embodiment.

On the other hand, breakdown voltage simulations were performed on a comparative example which has, instead of the gate electrode 21, a gate electrode (Schottky electrode) 311 having a rectangular section. FIG. 29 shows a potential distribution as a result of a simulation in which 150 (V) was applied between the gate electrode 311 and the drain electrode 2 of this comparative example.

In the structure of the gate electrode 21 of the second embodiment as shown in FIG. 2, the interior angle θ21 of the first corner 22 is larger than 90°, so that, as as apparent from FIG. 31, even if the interior angle θ22 of the second corner 23 is an acute angle, electric field concentration at the corner 22 of the electrode 21 can be suppressed, as compared with the structure of the gate electrode 311 having a rectangular section as shown in FIG. 29, thereby increasing the breakdown voltage between the electrodes.

Third Embodiment

Figure 3:
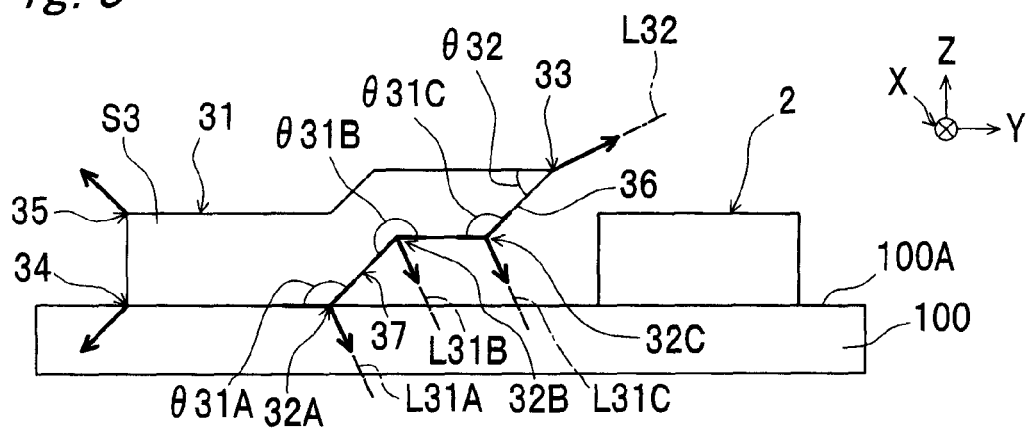
FIG. 3 is a partial cross-sectional view of a Schottky gate field-effect transistor as a third embodiment of the semiconductor device according to the present invention, showing electrode areas of the transistor.

FIG. 3 shows a partial cross-sectional view of a Schottky gate field-effect transistor as a third embodiment of the semiconductor device according to the present invention, showing electrode areas of the transistor.

The third embodiment is different from the first embodiment only in that a gate electrode 31 is provided instead of the gate electrode 1. In the third embodiment, parts same as or similar to the parts of the first embodiment are denoted by the same reference numerals or symbols as in the first embodiment to omit the description about them.

As shown in FIG. 3, the gate electrode 31 of the third embodiment has a section (Y-Z section) in the shape of a polygon S3 taken along a Y-Z plane. The polygon S3 has first corners 32A, 32B, and 32C and a second corner 33 on the drain electrode 2 side. The polygon S3 also has corners 34 and 35 the interior angles of which are substantially right angles on the side opposite to the drain electrode 2 side.

The outward extension lines L31A, L31B, and L31C of the bisectors of the interior angles of the first corners 32A, 32B, and 32C cross the semiconductor layer 100, and line images of the extension lines L31A, L31B, and L31C vertically projected onto the surface 100A of the semiconductor layer 100 extend between the gate electrode 31 and the drain electrode 2. The interior angles θ31A, θ31B, and θ31C of the first corners 32A, 32B, and 32C are larger than 90°, thus being obtuse angles.

As an example, the interior angles θ31A and θ31C are between 120° and 150°, more specifically, for example, 135°. Furthermore, as an example, the interior angle θ31B is between 210° and 240°, more specifically, for example, 225°.

An outward extension line L32 of a bisector of the interior angle of the second corner 33 does not cross the drain electrode 2 or the semiconductor layer 100. A line image of the extension line L32 vertically projected onto the surface 100A of the semiconductor layer 100 extends between the gate electrode 31 and the drain electrode 2. The interior angle θ32 of the second corner 33 is an acute angle, such as 45°. As shown in FIG. 3, the second corner 33 is adjacent to the first corner 32C and more distant from the semiconductor layer 100 than the first corner 32C is.

As shown in FIG. 3, the polygon S3 has an oblique side 36 which extends from the first corner 32C to the second corner 33. The polygon S3 also has an oblique side 37 which extends from the first corner 32A to the first corner 32B.

In the third embodiment, the gate electrode 31 extends in the X-axis direction (perpendicular to the paper face) with its Y-Z sections substantially in the shape of the polygon S3. Thus, the first corners 32A to 32C and the second corner 33 constitute corner portions on the drain electrode 2 side of the gate electrode 31, respectively. Furthermore, the oblique sides 36 and 37 of the polygon S3 form oblique surfaces on the drain electrode 2 side of the gate electrode 31.

In the third embodiment, the interior angles θ31A to θ31C of the first corners 32A to 32C on the ohmic drain electrode 2 side of the Schottky gate electrode 31 are larger than 90°. Because of this, it is possible to suppress concentration of electric fields between the gate electrode 31 and the drain electrode 2 on the first corners 32A to 32C of the gate electrode 31, thereby increasing the breakdown voltage between the electrodes.

Furthermore, in the third embodiment, although the interior angle θ32 of the second corner 33 of the polygon S3 is an acute angle, the outward extension line L32 of the bisector of the interior angle θ32 does not cross the drain electrode 2 or the semiconductor layer 100, so that electric fields between the gate electrode 31 and the drain electrode 2 hardly concentrate at the second corner 33. Because of this, even if the gate electrode 31 has, on its drain electrode 2 side, the second corner 33 whose interior angle θ2 is an acute angle, electric field concentration at the second corner 33 is suppressed, and therefore the decrease of the breakdown voltage between the electrodes is avoided. As a result, it is possible to improve the breakdown voltage performance.

In the third embodiment, the polygon S3 of the gate electrode 31 has two corners 34 and 35 on the source electrode (not shown) side, and the interior angles of the two corners 34 and 35 are right angles, but the source electrode (not shown) side shape of the polygon S3 may be similar to the drain electrode 2 side shape.

(Breakdown Voltage Simulation 3)

Figure 33:
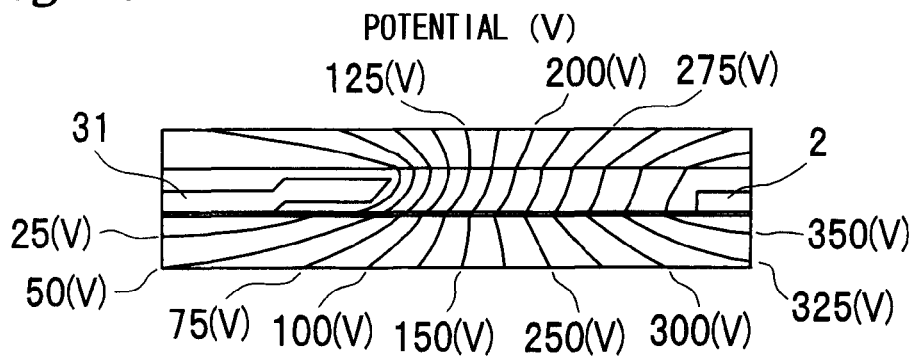
FIG. 33 shows a potential distribution obtained as a result of a breakdown voltage simulation of the third embodiment.

Simulations of breakdown voltages between a gate electrode 31 and a drain electrode 2 having structures equivalent to the gate electrode 31 and the drain electrode 2 of the third embodiment were performed. FIG. 33 show, a potential distribution as a result of a simulation wherein 350 (V) was applied between the gate electrode 31 and the drain electrode 2.

Figure 30:
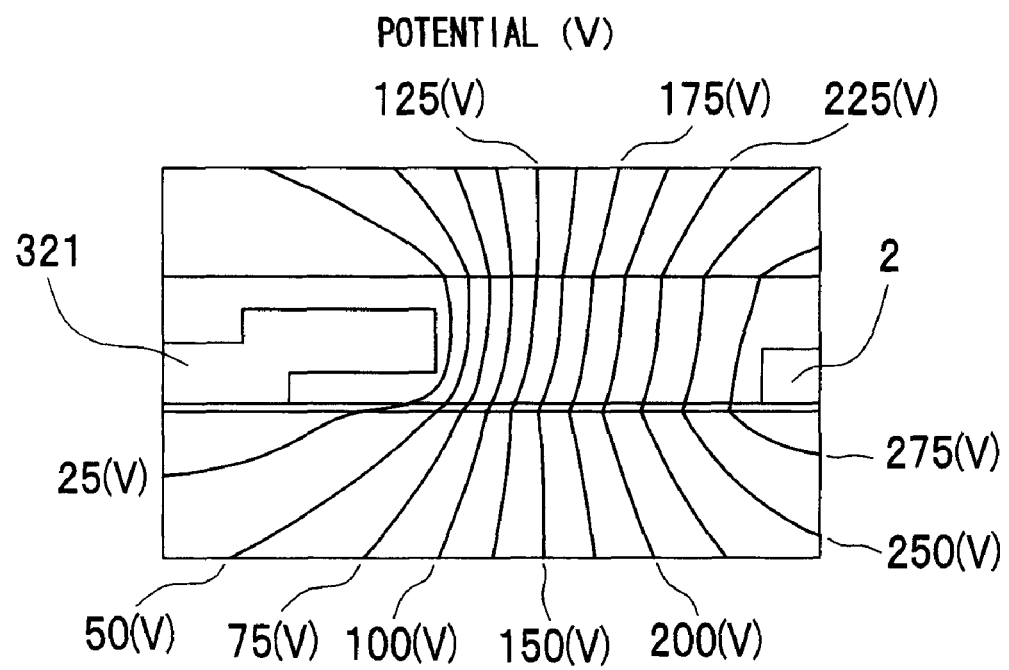
FIG. 30 shows a potential distribution obtained as a result of a breakdown voltage simulation of a comparative example of the third embodiment.

On the other hand, a breakdown voltage simulation was performed on a comparative example which has, instead of the gate electrode 31, a gate electrode (Schottky electrode) 321 having a polygonal section whose corners have interior angles of 90° or 270°, as shown in FIG. 30. FIG. 30 shows a potential distribution as a result of a simulation in which 300 (V) was applied between the gate electrode 321 and the drain electrode 2 of this comparative example.

In the structure of the gate electrode 31 of the third embodiment as shown in FIG. 33 and FIG. 3, the interior angles θ31A to θ31C of the first corners 32A to 32C are larger than 90°, so that even if the interior angle θ32 of the second corner 33 is an acute angle, electric field concentration at the corners of the electrode 31 is suppressed, thereby increasing the breakdown voltage between the electrodes, as compared with the structure of the gate electrode 321 in which the interior angles of the corners of its section are 90° or 270° as shown in FIG. 30.

Fourth Embodiment

Figure 4:
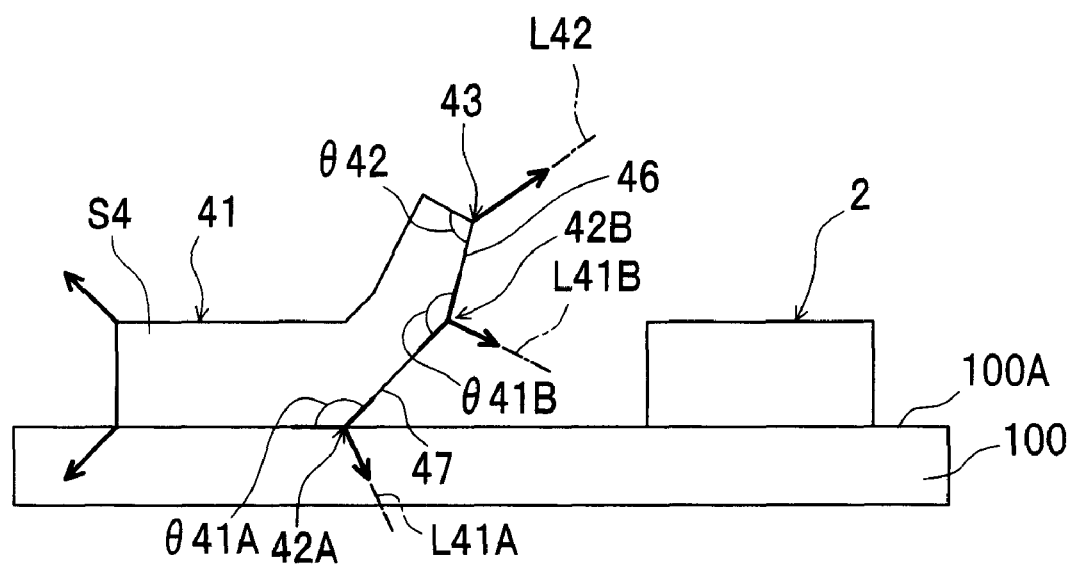
FIG. 4 is a partial cross-sectional view of a Schottky gate field-effect transistor as a fourth embodiment of the semiconductor device according to the present invention, showing electrode areas of the transistor.

FIG. 4 shows a partial cross-sectional view of a Schottky gate field-effect transistor as a fourth embodiment of the semiconductor device according to the present invention, showing electrode areas of the transistor.

The fourth embodiment is different from the first embodiment only in that a gate electrode 41 is provided instead of the gate electrode 1. Therefore, in the fourth embodiment, parts same as or similar to the parts of the first embodiment are denoted by the same reference numerals or symbols as in the first embodiment to omit the descriptions about them.

A polygon S4, which is the shape of a section (Y-Z section) of the gate electrode 41 as the first electrode taken along a Y-Z plane, has first corners 42A and 42B and a second corner 43 on the drain electrode side.

An outward extension line L41A of a bisector of the interior angle of the first corner 42A crosses the semiconductor layer 100, and a line image of the extension line L41A vertically projected onto the surface 100A of the semiconductor layer 100 extends between the gate electrode 41 and the drain electrode 2. The interior angle θ41A of the first corner 42A is larger than 90°, thus being an obtuse angle. As an example, the interior angle θ41A is between 120° and 150°, more specifically, for example, 135°.

An outward extension line L41B of a bisector of the interior angle of the other first corner 42B crosses the drain electrode 2, and a line image of the extension line L41B vertically projected onto the surface 100A of the semiconductor layer 100 extends between the gate electrode 41 and the drain electrode 2. The interior angle θ41B of the first corner 42B is larger than 90°, thus being an obtuse angle. As an example, the interior angle θ41B is between 120° and 150°, more specifically, for example, 145°.

An outward extension line L42 of a bisector of the interior angle of the second corner 43 does not cross the drain electrode 2 or the semiconductor layer 100. A line image of the extension line L42 vertically projected onto the surface 100A of the semiconductor layer 100 extends between the gate electrode 41 and the drain electrode 2. The interior angle θ42 of the second corner 43 is an obtuse angle, such as 115°. As shown in FIG. 1, the second corner 43 is more distant from the semiconductor layer 100 than the first corner 42B.

As shown in FIG. 4, the polygon S4 has an oblique side 47 which extends from the first corner 42A to the other first corner 42B, and an oblique side 46 which extends from the first corner 42B to the second corner 43.

In the fourth embodiment, the gate electrode 41 extends in the X-axis direction (perpendicular to the paper face) with its Y-Z sections substantially in the shape of the polygon S4. Thus, the first corners 42A and 42B and the second corner 43 form corner portions on the drain electrode 2 side of the gate electrode 41, respectively. Furthermore, the oblique side 47 of the polygon S4 constitutes an oblique surface on the drain electrode 2 side of the gate electrode 41, and the oblique side 46 of the polygon S4 constitutes an oblique surface on the drain electrode 2 side of the gate electrode 41.

In the fourth embodiment, the interior angles θ41A and θ41B of the first corners 42A and 42B on the ohmic drain electrode 2 side of the Schottky gate electrode 41 are larger than 90°. Because of this, it is possible to suppress concentration of electric fields between the gate electrode 41 and the drain electrode 2 on the first corners 42A and 42B of the gate electrode 41, thereby increasing the breakdown voltage between the electrodes.

Furthermore, in the fourth embodiment, because the interior angle θ42 of the second corner 43 of the polygon S4 is an obtuse angle and the outward extension line L42 of the bisector of the interior angle θ42 does not cross the drain electrode 2 or the semiconductor layer 100, electric fields between the gate electrode 41 and the drain electrode 2 hardly concentrate at the second corner 43. Because of this, the decrease of the breakdown voltage between the electrodes can be avoided. Thus, it is possible to improve the breakdown voltage performance.

In the fourth embodiment, the polygon S4 has two corners 44 and 45 on the source electrode (not shown) side, and the interior angles of the two corners 44 and 45 are substantially right angles, but the source electrode side shape of the polygon S4 may be similar to the drain electrode 2 side shape.

Fifth Embodiment

FIG. 5 shows a partial cross-sectional view of a Schottky gate field-effect transistor as a fifth embodiment of the semiconductor device according to the present invention, showing electrode areas of the transistor.

The fifth embodiment is different from the first embodiment only in that a high dielectric film 51 made of a material having a higher dielectric constant than the semiconductor layer 100 is formed on the surface 100A of the semiconductor layer 100 between the gate electrode 1 and the drain electrode 2. In the fifth embodiment, parts same as or similar to the parts of the first embodiment are denoted by the same reference numerals or symbols as in the first embodiment and mainly points different from the first embodiment will be described.

As shown in FIG. 5, the high dielectric film 51 is formed on the surface 100A of the semiconductor layer 100, and extends in the X-axis direction between the gate electrode 1 and the drain electrode 2. The high dielectric film 51 covers and is in contact with a corner portion including the first corner 3 on the drain electrode 2 side of the polygon S1 consisting of the Y-Z section of the gate electrode 1, a corner portion including the third corner 6 of the polygon S1, and an oblique surface including the oblique side 11 of the polygon S1.

Also, the high dielectric film 51 is in contact with and covers a lower half of a vertical surface including the vertical side 7 of the gate electrode 1. The high dielectric film 51 is in contact with and covers the surface 100A of the semiconductor layer 100 between the gate electrode 1 and the drain electrode 2. Also, the high dielectric film 51 is in contact with and covers a gate electrode 1-side end face 2A of the drain electrode 2.

In the fifth embodiment, because the high dielectric film 51 covers the gate electrode 1 from the corner portion of the first corner 3 to or even beyond the corner portion of the third corner 6, electric field is concentration at the corners 3 and 6 on the drain electrode 2 side of the gate electrode 1 is mitigated more, as compared with the first embodiment, thereby further increasing the breakdown voltage between the electrodes.

In the fifth embodiment, the high dielectric film 51 extends until it comes into contact with the end face 2A of the drain electrode 2, but there may be a gap between the high dielectric film 51 and the drain electrode 2. The high dielectric film 51 may be, for example, a metal oxide film including at least one element selected from a group consisting of Hf, Ti, Nb, Ta, Zr, La, Y, Ba, Sr, and Mg; a SiNx film; or the like.

Sixth Embodiment

FIG. 6 shows a partial cross-sectional view of a Schottky gate field-effect transistor as a sixth embodiment of the semiconductor device according to the present invention, showing electrode areas of the transistor.

The sixth embodiment is different from the second embodiment only in that a high dielectric film 61 made of a material having a higher dielectric constant than the semiconductor layer 100 is formed on the surface 100A of the semiconductor layer 100 between the gate electrode 21 and the drain electrode 2. Therefore, in the sixth embodiment, parts same as or similar to the parts of the second embodiment are denoted by the same reference numerals or symbols as in the second embodiment, and mainly points different from the second embodiment will be described.

As shown in FIG. 6, the high dielectric film 61 is formed on the surface 100A of the semiconductor layer 100, and extends in the X-axis direction between the gate electrode 21 and the drain electrode 2. The high dielectric film 61 covers and is in contact with the corner portion including the first corner 22 on the drain electrode 2 side of the polygon S2 consisting of a section of the gate electrode 21, the corner portion including the second corner 23 of the polygon S2, and an oblique surface including the oblique side 25 of the polygon 52.

Also, the high dielectric film 61 is in contact with and covers the surface 100A of the semiconductor layer 100 between the gate electrode 21 and the drain electrode 2. Also, the high dielectric film 61 is in contact with and covers the gate electrode 21-side end face 2A of the drain electrode 2.

In the sixth embodiment, because the high dielectric film 61 covers the gate electrode 21 from the corner portion of the first corner 22 to the corner portion of the second corner 23, electric field concentration at the corners 22 and 23 on the drain electrode 2 side of the gate electrode 21 is mitigated more, as compared with the second embodiment, thereby further increasing the breakdown voltage between the electrodes.

In the sixth embodiment, the high dielectric film 61 extends until it comes into contact with the end face 2A of the drain electrode 2, but there may be a gap between the high dielectric film 61 and the drain electrode 2. Of the corner portions of the first and second corners 22 and 23, only the corner portion of the first corner 22 may be covered with the high dielectric film 61.

Seventh Embodiment

FIG. 7 shows a partial cross-sectional view of a Schottky gate field-effect transistor as a seventh embodiment of the semiconductor device according to the present invention, showing electrode areas of the transistor.

The seventh embodiment is different from the third embodiment only in that a high dielectric film 71 made of a material having a higher dielectric constant than the semiconductor layer 100 is formed on the surface 100A of the semiconductor layer 100 between the gate electrode 31 and the drain electrode 2. Therefore, in the seventh embodiment, parts same as or similar to the parts of the third embodiment are denoted by the same reference numerals or symbols as in the third embodiment, and mainly points different from the third embodiment will be described.

As shown in FIG. 7, the high dielectric film 71 is formed on the surface 100A of the semiconductor layer 100, and extends in the X-axis direction between the gate electrode 31 and the drain electrode 2. The high dielectric film 71 covers the corner portions including the first corners 32A, 32B, and 32C on the drain electrode 2 side of the polygon S3 consisting of the cross section of the gate electrode 31 and oblique surfaces including the oblique sides 36 and 37 of the polygon S3.

Also, the high dielectric film 71 covers the surface 100A of the semiconductor layer 100 between the gate electrode 31 and the drain electrode 2. Also, the high dielectric film 71 is in contact with and covers the gate electrode 31-side end face 2A of the drain electrode 2.

In the seventh embodiment, because the high dielectric film 71 covers the gate electrode 31 over an area ranging from the corner portion of the first corner 32A, through the oblique surface including the oblique side 37 and then the corner portion of the first corner 32B, to the corner portion of the first corner 32C, electric field concentration at the corners 32A, 32B, 32C on the drain electrode 2 side of the gate electrode 31 is mitigated more, as compared with the third embodiment, thereby further increasing the breakdown voltage between the electrodes.

In the seventh embodiment, the high dielectric film 71 extends until it comes into contact with the End face 2A of the drain electrode 2, but there may be a cap between the high dielectric film 71 and the drain electrode 2. In addition to the corner portions of the first corners 32A, 32B, 32C, the corner portion of the second corner 33 may be covered with the high dielectric film 71.

Eighth Embodiment

Figure 8:
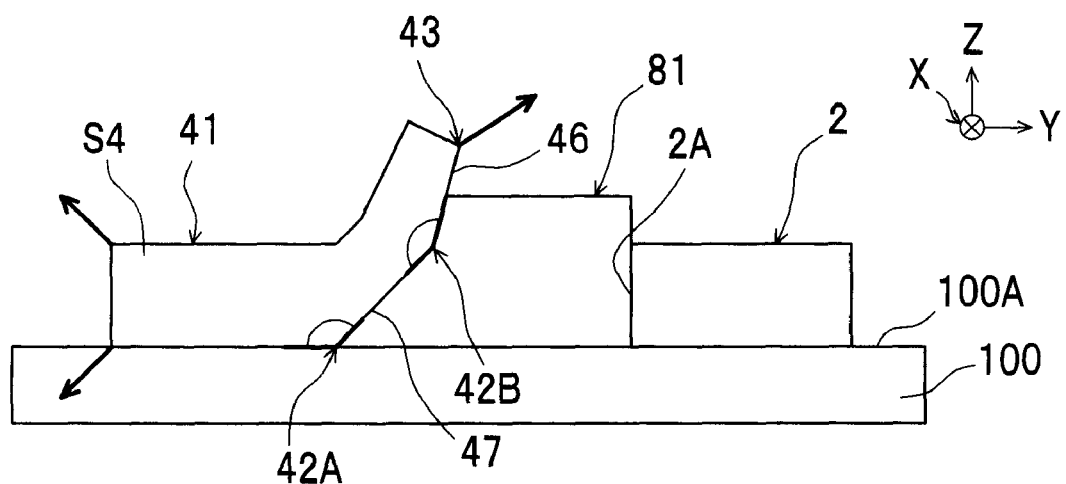
FIG. 8 is a partial cross-sectional view of a Schottky gate field-effect transistor as an eighth embodiment of the semiconductor device according to the present invention, showing electrode areas of the transistor.

FIG. 8 shows a partial cross-sectional view of a Schottky gate field-effect transistor as an eighth embodiment of the semiconductor device according to the present invention, showing electrode areas of the transistor.

The eighth embodiment is different from the fourth embodiment only in that a high dielectric film 81 made of a material having a higher dielectric constant than the semiconductor layer 100 is formed on the surface 100A of the semiconductor layer 100 between the gate electrode 41 and the drain electrode 2. Therefore, in the eighth embodiment, parts same as or similar to the parts of the fourth embodiment are denoted by the same reference numerals or symbols as in the fourth embodiment, and mainly points different from the fourth embodiment will be described.

As shown in FIG. 8, the high dielectric film 81 is formed on the surface 100A of the semiconductor layer 100, and extends in the X-axis direction between the gate electrode 41 and the drain electrode 2. The high dielectric film 81 covers the corner portions including the first corners 42A and 42B on the drain electrode 2 side of the polygon S4 consisting of the cross section of the gate electrode 41, the oblique surface including the oblique side 47, and a part of the oblique surface including the oblique side 46 of the polygon S4.

Also, the high dielectric film 81 covers the surface 100A of the semiconductor layer 100 between the gate electrode 41 and the drain electrode 2. Also, the high dielectric film 81 is in contact with and covers the gate electrode 41-side end face 2A of the drain electrode 2.

In the eighth embodiment, because the high dielectric film 81 covers the gate electrode 41 over an area including the corner portion of the first corner 42A, the oblique surface including the oblique side 47, the corner portion of the first corner 42B, and the part of the oblique surface including the oblique side 46, electric field concentration at the corners 42A and 42B on the drain electrode 2 side of the gate electrode 41 is mitigated more, as compared with the fourth embodiment, thereby further increasing the breakdown voltage between the electrodes.

In the eighth embodiment, the high dielectric film 81 extends until it comes into contact with the end face 2A of the drain electrode 2, but there may be a gap between the high dielectric film 81 and the drain electrode 2. In addition to the corner portions of the first corners 42A and 42B, the corner portion of the second corner 43 may also be covered with the high dielectric film 81.

Ninth Embodiment

FIG. 9 shows a partial cross-sectional view of a Schottky gate field-effect transistor as a ninth embodiment of the semiconductor device according to the present invention, showing electrode areas of the transistor.

The ninth embodiment is different from the fifth embodiment only in that three high dielectric films 91 to 93 made of materials having higher dielectric constants than the semiconductor layer 100 are provided instead of the high dielectric film 51 in FIG. 5. Therefore, in the ninth embodiment, parts same as or similar to the parts of the fifth embodiment are denoted by the same reference numerals or symbols as in the fifth embodiment, and mainly points different from the fifth embodiment will be described.

As shown in FIG. 9, the high dielectric film 91 is formed on the surface 100A of the semiconductor layer 100, and extends in the X-axis direction between the gate electrode 1 and the drain electrode 21. The high dielectric film 91 covers and in contact with a drain electrode 2 side of the gate electrode 1, namely, a corner portion including the first corner 3 of the polygon S1, which is the shape of the Y-Z section of the gate electrode 1, an oblique surface including the oblique side 11 of the polygon S1, a corner portion including the third corner 6, and a lower half of a vertical surface including the vertical side 7. The high dielectric film 91 is in contact with and covers the surface 100A of the semiconductor layer 100 between the gate electrode 1 and the drain electrode 2. Also, the high dielectric film 91 is in contact with and covers the gate electrode 1-side end face 2A of the drain electrode 2.

The high dielectric film 92 is formed on the high dielectric film 91 to cover about the upper half of the vertical surface including the vertical side 7 of the gate electrode 1. The high dielectric film 92 is shorter than the high dielectric film 91 in the Y-axis direction, and does not reach the drain electrode 2.

The high dielectric film 93 is formed on the high dielectric film 92 and the oblique side 12, and covers the top of a corner portion including the second corner 5. The top of the corner portion including the second corner 5 is sandwiched between an oblique surface including the oblique side 12 and the vertical surface including the vertical side 7.

Thus, the first corner 3, the second corner 5, and the third corner 6 are able to be surely covered with the three high dielectric films 91 to 93.

In the ninth embodiment, the three high dielectric films 91 to 93 cover not only the corner portion including the first corner 3 and the corner portion including the third corner 6 but also the corner portion including the second corner 5, so that electric field concentration on the drain electrode 2 side corner portions of the gate electrode 1 can be more suppressed, thereby further increasing the breakdown voltage between the electrodes.

In the ninth embodiment, the high dielectric film 91 extends until it comes into contact with the end face 2A of the drain electrode 2, but there may be a gap between the high dielectric film 91 and the drain electrode 2.

Tenth Embodiment

FIG. 10 shows a partial cross-sectional view of a Schottky gate field-effect transistor as a tenth embodiment of the semiconductor device according to the present invention, showing electrode areas of the transistor.

The tenth embodiment is different from the sixth embodiment only in that three high dielectric films 101 to 103 made of materials having higher dielectric constants than the semiconductor layer 100 are provided instead of the high dielectric film 61 in FIG. 6. Therefore, in the tenth embodiment, parts same as or similar to the parts of the sixth embodiment are denoted by the same reference numerals or symbols as in the sixth embodiment, and mainly points different from the sixth embodiment will be described.

As shown in FIG. 10, the high dielectric film 101 is formed on the surface 100A of the semiconductor layer 100, and extends in the X-axis direction between the gate electrode 21 and the drain electrode 2. The high dielectric film 101 covers a drain electrode 2 side of the gate electrode 21, namely, a corner portion including the first corner 22 of the polygon S2 which is the shape of the Y-Z section of the gate electrode 21, an oblique surface including the oblique side 25 of the polygon S2, and a corner portion including the second corner 23 of the polygon S2. The high dielectric film 101 extends in the Y-axis direction between the gate electrode 21 and the drain electrode 2 and is in contact with and covers the surface 100A of the semiconductor layer 100. Also, the high dielectric film 101 is in contact with and covers the gate electrode 21-side end face 2A of the drain electrode 2.

The high dielectric film 102 is formed on the high dielectric film 101, is aligned with the high dielectric film 101 at the gate electrode 21-side end, and is shorter than the high dielectric film 101 in the Y-axis direction. The high dielectric film 103 is formed on the high dielectric film 102, is aligned with the high dielectric film 102 at the gate electrode 21-side end, and is shorter than the high dielectric film 102 in the Y-axis direction.

In the tenth embodiment, because the three high dielectric films 101 to 103 cover not only the corner portion including the first corner 22 of the gate electrode 21 but also the corner portion including the second corner 23, electric field concentration on the drain electrode 2 side corner portions of the gate electrode 21 is suppressed, thereby further increasing the breakdown voltage between the electrodes.

In the tenth embodiment, the high dielectric film 101 extends until it comes into contact with the end face 2A of the drain electrode 2, but there may be a gap between the high dielectric film 101 and the drain electrode 2.

Eleventh Embodiment

FIG. 11 shows a partial cross-sectional view of a Schottky gate field-effect transistor as an eleventh embodiment of the semiconductor device according to the present invention, showing electrode areas of the transistor.

The eleventh embodiment is different from the seventh embodiment only in that three high dielectric films 111 to 113 made of materials having higher dielectric constants than the semiconductor layer 100 are provided instead of the high dielectric film 71 in FIG. 7. Therefore, in the eleventh embodiment, parts same as or similar to the parts of the seventh embodiment are denoted by the same reference numerals or symbols as in the seventh embodiment, and mainly points different from the seventh embodiment will be described.

As shown in FIG. 11, the high dielectric film 111 is formed on the surface 100A of the semiconductor layer 100, and extends in the X-axis direction between the gate electrode 31 and the drain electrode 2. The high dielectric film 111 covers corner portions including the first corners 32A to 32C on the drain electrode 2 side of the polygon S3 which is the shape of the Y-Z section of the gate electrode 31, an oblique surface including the oblique side 37 of the polygon S3, and a lower half of an oblique surface including the oblique side 36 of the polygon S3. The high dielectric film 111 extends in the Y-axis direction between the gate electrode 31 and the drain electrode 2 and is in contact with and covers the surface 100A of the semiconductor layer 100. Also, the high dielectric film 111 is in contact with and covers the gate electrode 31-side end face 2A of the drain electrode 2.

The high dielectric film 232 is formed on the high dielectric film 111, and covers an upper part of the oblique surface including the oblique side 36, a corner portion including the second corner 33 of the polygon S3, a top face including a top side 39 of the polygon S3, and an oblique surface 38 connected to the top face. The high dielectric film 232 is aligned or almost aligned with the high dielectric film 111 on the Y coordinate of its gate electrode 31-side end, that is, the high dielectric film 232 has a gate electrode 31-side end that is substantially same as that of the high dielectric film 111 in Y coordinate, but is shorter than the high dielectric film 111 in the Y-axis direction.

The high dielectric film 113 is formed on the high dielectric film 232 and is aligned or almost aligned with the high dielectric film 232 on the Y coordinate of its gate electrode 31-side end. The drain electrode 2-side end of the high dielectric film 113 is positioned nearer to the drain electrode 2 than the corner portion including the second corner 33 in the Y-axis direction, but the high dielectric film 113 is shorter than the high dielectric film 232 in the Y-axis direction.

In the eleventh embodiment, because the three high dielectric films 111 to 113 cover not only the corner portions including the first corners 32A to 32C of the gate electrode 31 but also the corner portion including the second corner 33, electric field concentration on the drain electrode 2 side corner portions of the gate electrode 31 is suppressed, thereby further increasing the breakdown voltage between the electrodes.

In the eleventh embodiment, the high dielectric film 111 extends until it comes into contact with the end face 2A of the drain electrode 2, but there may be a gap between the high dielectric film 111 and the drain electrode 2.

Twelfth Embodiment

Figure 12:
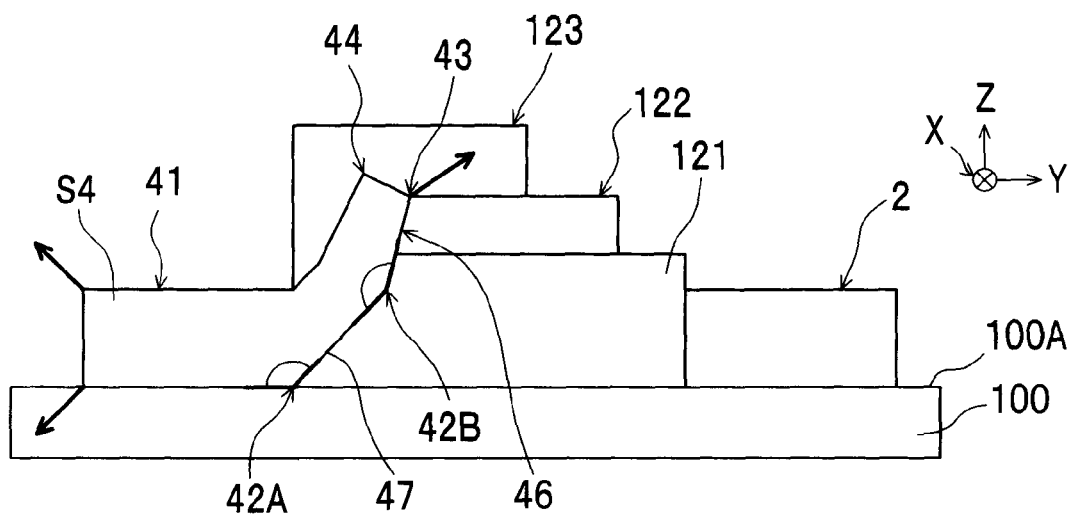
FIG. 12 is a partial cross-sectional view of a Schottky gate field-effect transistor as a twelfth embodiment of the semiconductor device according to the present invention, showing electrode areas of the transistor.

FIG. 12 shows a partial cross-sectional view of a Schottky gate field-effect transistor as an eleventh embodiment of the semiconductor device according to the present invention, showing electrode areas of the transistor.

The twelfth embodiment is different from the eighth embodiment only in that three high dielectric films 121 to 123 made of materials having higher dielectric constants than the semiconductor layer 100 are provided instead of the high dielectric film 81 in FIG. 8. Therefore, in the twelfth embodiment, parts same as or similar to the parts of the twelfth embodiment are denoted by the same reference numerals or symbols as in the eighth embodiment, and mainly points different from the eighth embodiment will be described.

As shown in FIG. 12, the high dielectric film 121 is formed on the surface 100A of the semiconductor layer 100, and covers a corner portion including the first corner 42A, an oblique surface including the oblique side 47, a corner portion including the first corner 42B, and a lower half of an oblique surface including the oblique side 46. The high dielectric film 121 covers the surface 100A of the semiconductor layer 100 between the gate electrode 41 and the drain electrode 2. Also, the high dielectric film 121 is in contact with and covers the gate electrode 41-side end face 2A of the drain electrode 2.

The high dielectric film 122 is formed on the high dielectric film 121, and covers an upper half of the oblique surface including the oblique side 46 to the top or vertex of a corner portion including the second corner 43. The high dielectric film 122 has a width shorter than the high dielectric film 121 in the Y-axis direction, and the drain electrode 2-side end of the high dielectric film 122 does not thus reach the drain electrode 2-side end of the high dielectric film 121.

The high dielectric film 123 is formed on the high dielectric film 122, and covers the top or vertex of the corner portion including the second corner 43, and a corner portion including the corner 44 adjacent to the second corner 43. The drain electrode 2-side end of the high dielectric film 123 does not reach the drain electrode 2-side end of the high dielectric film 122.

In the twelfth embodiment, because the three high dielectric films 121 to 123 cover not only the corner portions including the first corners 42A and 42B of the gate electrode but also the corner portions including the second corner 43 and the adjacent corner 44, respectively, electric field concentration on the drain electrode 2 side corner portions of the gate electrode 41 is suppressed, thereby further increasing the breakdown voltage between the electrodes.

In the twelfth embodiment, the high dielectric film 121 extends until it comes into contact with the end face 2A of the drain electrode 2, but there may be a gap between the high dielectric film 121 and the drain electrode 2.

Thirteenth Embodiment

FIG. 13 shows a partial cross-sectional view of a field-effect transistor of MIS electrode structure as a thirteenth embodiment of the semiconductor device according to the present invention, showing electrode areas of the transistor.

The thirteenth embodiment is different from the first embodiment only in that the gate electrode 1 in FIG. 1 is replaced with a MIS electrode formed above the surface 100A of the semiconductor layer 100 with an insulating film 118 between the gate electrode 1 and the semiconductor layer 100. The insulating film 118 may be a high dielectric film made of a material having a higher dielectric constant than the semiconductor layer 100.

According to the thirteenth embodiment, a field-effect transistor of MIS electrode structure with an increased breakdown voltage between the electrodes can be realized.

Fourteenth Embodiment

FIG. 14 shows a partial cross-sectional view of a field-effect transistor of MIS electrode structure as a fourteenth embodiment of the semiconductor device according to the present invention, showing electrode areas of the transistor.

The fourteenth embodiment is different from the second embodiment only in that the gate electrode 21 in FIG. 2 is replaced with a MIS electrode formed above the surface 100A of the semiconductor layer 100 with an insulating film 128 between the gate electrode 21 and the semiconductor layer 100. The insulating film 128 may be a high dielectric film made of a material having a higher dielectric constant than the semiconductor layer 100.

According to the fourteenth embodiment, a field-effect transistor of MIS electrode structure with an increased breakdown voltage between the electrodes can be realized.

Fifteenth Embodiment

FIG. 15 shows a partial cross-sectional view of a field-effect transistor of MIS electrode structure as a fifteenth embodiment of the semiconductor device according to the present invention, showing electrode areas of the transistor.

The fifteenth embodiment is different from the third embodiment only in that the gate electrode 31 in FIG. 3 is replaced with a MIS electrode formed above the surface 100A of the semiconductor layer 100 with an insulating film 138 between the gate electrode 31 and the semiconductor layer 100. The insulating film 138 may be a high dielectric film made of a material having a higher dielectric constant than the semiconductor layer 100.

According to the fifteenth embodiment, a field-effect transistor of MIS electrode structure with an increased breakdown voltage between the electrodes can be realized.

Sixteenth Embodiment

Figure 16:
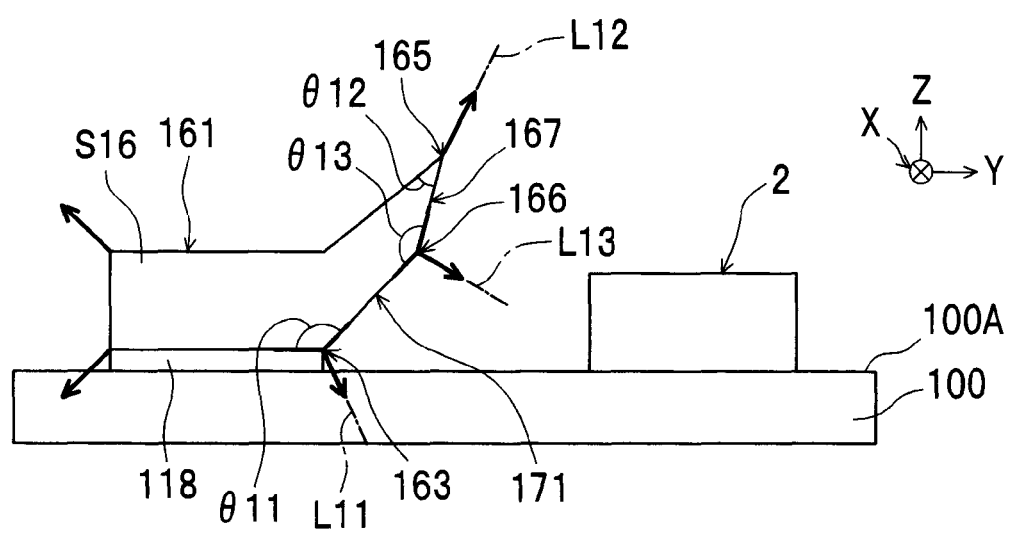
FIG. 16 is a partial cross-sectional view of a field-effect transistor of MIS electrode structure as a sixteenth embodiment of the semiconductor device according to the present invention, showing electrode areas of the transistor.

FIG. 16 shows a partial cross-sectional view of a field-effect transistor of MIS electrode structure as a sixteenth embodiment of the semiconductor device according to the present invention, showing electrode areas of the transistor.

The sixteenth embodiment is a variation of the thirteenth embodiment in FIG. 13, and is different from the thirteenth embodiment in that a gate electrode 161 is provided instead of the gate electrode 1.

In a polygon S16 consisting of a section (Y-Z section) of the gate electrode 161 taken along a Y-Z plane, the gate electrode 161 has a first corner 163 whose interior angle $\theta 11$ is identical to the interior angle $\theta 1$ of the first corner 3 of the gate electrode 1. The gate electrode 161 also has a third corner 166 whose interior angle $\theta 13$ is larger than the interior angle $\theta 3$ of the third corner 6 of the gate electrode 1. The interior angle $\theta 13$ is 145°, for example.

An outward extension line L11 of a bisector of the interior angle $\theta 11$ crosses the semiconductor 100, and an outward extension line L13 of a bisector of the interior angle $\theta 13$ crosses the drain electrode 2. Line images of the extension lines L11 and L13 vertically projected onto the surface 100A of the semiconductor layer 100 extend between the gate electrode 161 and the drain electrode 2.

The gate electrode 161 also has a second corner 165 which is more distant from the surface 100A of the semiconductor layer 100 than the third corner 166 is. An outward extension line L12 of a bisector of the interior angle of the second corner 165 does not cross the drain electrode 2 or the semiconductor layer 100. A line image of the extension line L12 vertically projected onto the surface 100A of the semiconductor layer 100 extends between the gate electrode 161 and the drain electrode 2. The interior angle $\theta 12$ of the second corner 165 is an acute angle, such as 35°.

In the sixteenth embodiment, the polygon S16 consisting of the Y-Z section of the gate electrode 161 has an oblique side 171 between the first corner 163 and the third corner 166, and an oblique side 167 between the third corner 166 and the second corner 165.

In the sixteenth embodiment, the gate electrode 161 extends in the X-axis direction (perpendicular to the paper face) with its Y-Z sections substantially in the shape of the polygon S16. Thus, the first corner 163, second corner 165, and third corner 166 constitute a first corner portion, second corner portion, and third corner portion on the drain electrode 2 side of the gate electrode 161, respectively. Furthermore, the oblique side 167 of the polygon S16 constitutes an oblique surface on the drain electrode 2 side of the gate electrode 161, and the oblique side 167 of the polygon S16 constitutes an oblique surface on the drain electrode 2 side of the gate electrode 161.

In the sixteenth embodiment, the interior angle $\theta 11$ of the first corner 163 on the ohmic drain electrode 2 side of the gate electrode 161 is larger than 90°. Because of this, it is possible to suppress concentration of electric fields between the gate electrode 161 and the drain electrode 2 on the first corner 163 of the gate electrode 161, thereby increasing the breakdown voltage between the electrodes.

Furthermore, in the sixteenth embodiment, although the interior angle θ2 of the second corner 165 of the polygon S16 is an acute angle, the outward extension line L12 of the bisector of the interior angle θ12 does not cross the drain electrode 2 or the semiconductor layer 100, so that electric fields between the gate electrode 161 and the drain electrode 2 hardly concentrate at the second corner 165. Because of this, even if the gate electrode 161 has, on its drain electrode 2 side, the second corner 165 whose interior angle θ2 is an acute angle, electric field concentration at the second corner 165 is suppressed, and therefore the decrease of the breakdown voltage between the electrodes is avoided. As a result, it is possible to improve the breakdown voltage performance.

Furthermore, in the sixteenth embodiment, the polygon S16 has the third corner 166 adjacent to the first corner 163 and the second corner 165, wherein similarly to the first corner 163, the interior angle θ13 of the third corner 166 is an obtuse angle and the extension line L13 of the bisector of the interior angle θ13 reaches the drain electrode 2. The existence of two obtuse angle corner portions comprised of the third corner 166 and the first corner 163 can more mitigate electric field concentration on the drain electrode 2 side portion of the gate electrode 161 to further increase the breakdown voltage between the electrodes.

According to the sixteenth embodiment, a field-effect transistor of MIS electrode structure with an increased breakdown voltage between the electrodes can be realized.

Seventeenth Embodiment

Figure 17:
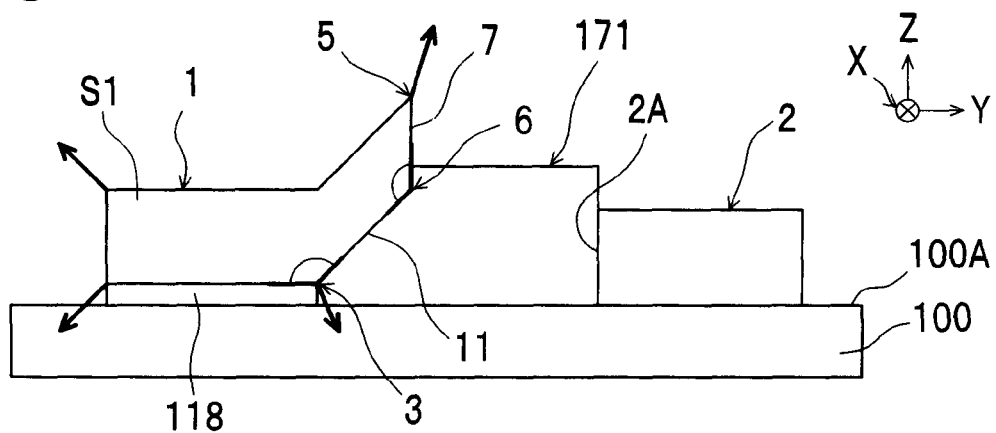
FIG. 17 is a partial cross-sectional view of a field-effect transistor of MIS electrode structure as a seventeenth embodiment of the semiconductor device according to the present invention, showing electrode areas of the transistor.

FIG. 17 shows a partial cross-sectional view of a field-effect transistor of MIS electrode structure as a seventeenth embodiment of the semiconductor device according to the present invention, showing electrode areas of the transistor.

The seventeenth embodiment is a variation of the thirteenth embodiment shown in FIG. 13, and is different from the thirteenth embodiment only in that a high dielectric film 171 made of a material having a higher dielectric constant than the semiconductor layer 100 is formed on the surface 100A of the semiconductor layer 100 between the gate electrode 1 and the drain electrode 2. In the seventeenth embodiment, parts same as or similar to the parts of the thirteenth embodiment are denoted by the same reference numerals or symbols as in the thirteenth embodiment and mainly points different from the thirteenth embodiment will be described.

As shown in FIG. 17, the high dielectric film 171 is formed on the surface 100A of the semiconductor layer 100, and extends in the X-axis direction between the gate electrode 1 and the drain electrode 2. The high dielectric film 171 covers a corner portion including the first corner 3 on the drain electrode 2 side of the polygon S1 consisting of the Y-Z section of the gate electrode 1, a corner portion including the third corner 6 of the polygon S1, and an oblique surface including the oblique side 11 of the polygon S1.

Also, the high dielectric film 171 is in contact with and covers a lower half of a vertical surface including the vertical side 7 of the gate electrode 1. The high dielectric film 171 is in contact with and covers the surface 100A of the semiconductor layer 100 between the gate electrode 1 and the drain electrode 2. Also, the high dielectric film 171 is in contact with and covers the gate electrode 1-side end face 2A of the drain electrode 2.

In the seventeenth embodiment, because the high dielectric film 171 covers the gate electrode 1 from the corner portion of the first corner 3 to or even beyond the corner portion of the third corner 6, electric field concentration at the corners 3 and 6 on the drain electrode 2 side of the gate electrode 1 is mitigated more, as compared with the thirteenth embodiment, thereby further increasing the breakdown voltage between the electrodes.

In the seventeenth embodiment, the high dielectric film 171 extends until it comes into contact with the end face 2A of the drain electrode 2, but there may be a gap between the high dielectric film 171 and the drain electrode 2. The high dielectric film 171 may be, for example, a metal oxide film including at least one element selected from a group consisting of Hf, Ti, Nb, Ta, Zr, La, Y, Ba, Sr, and Mg; a SiNx film; or the like.

Eighteenth Embodiment

Figure 18:
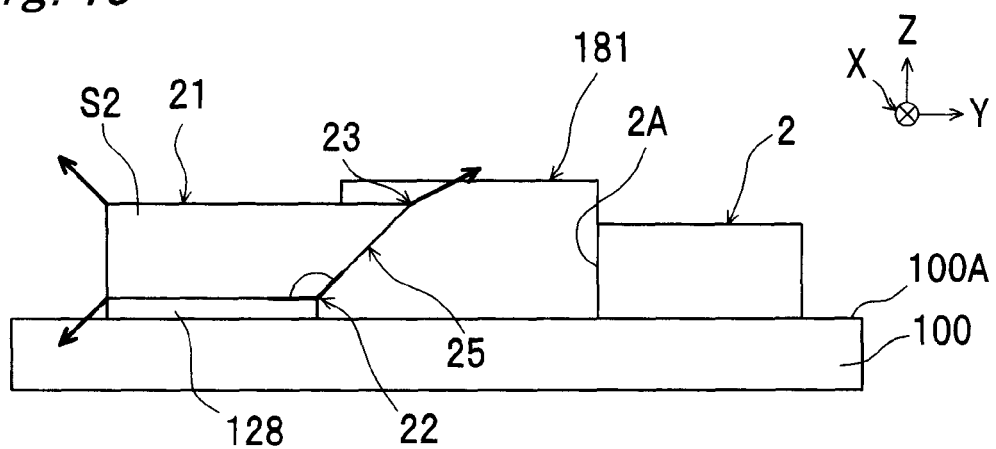
FIG. 18 is a partial cross-sectional view of a field-effect transistor of MIS electrode structure as an eighteenth embodiment of the semiconductor device according to the present invention, showing electrode areas of the transistor.

FIG. 18 shows a partial cross-sectional view of a field-effect transistor of MIS electrode structure as a eighteenth embodiment of the semiconductor device according to the present invention, showing electrode areas of the transistor.

The eighteenth embodiment is a variation of the fourteenth embodiment shown in FIG. 14, and is different from the fourteenth embodiment only in that a high dielectric film 181 made of a material having a higher dielectric constant than the semiconductor layer 100 is formed on the surface 100A of the semiconductor layer 100 between the gate electrode 21 and the drain electrode 2. In the eighteenth embodiment, parts same as or similar to the parts of the fourteenth embodiment are denoted by the same reference numerals or symbols as in the fourteenth embodiment and mainly points different from the fourteenth embodiment will be described.

As shown in FIG. 18, the high dielectric film 181 is formed on the surface 100A of the semiconductor layer 100, and extends in the X-axis direction between the gate electrode 21 and the drain electrode 2. The high dielectric film 181 covers and is in contact with the corner portion including the first corner 22 on the drain electrode 2 side of the polygon S2 consisting of a section of the gate electrode 21, the corner portion including the second corner 23 of the polygon S2, and an oblique surface including the oblique side 25 of the polygon S2.

Also, the high dielectric film 181 is in contact with and covers the surface 100A of the semiconductor layer 100 between the gate electrode 21 and the drain electrode 2. Also, the high dielectric film 61 is in contact with and covers the gate electrode 21-side end face 2A of the drain electrode 2.

In the eighteenth embodiment, because the high dielectric film 181 covers the gate electrode 21 from the corner portion of the first corner 22 to the corner portion of the second corner 23, electric field concentration at the corners 22 and 23 on the drain electrode 2 side of the gate electrode 21 is relieved more, as compared with the fourteenth embodiment, thereby further increasing the breakdown voltage between the electrodes.

In the eighteenth embodiment, the high dielectric film 181 extends until it comes into contact with the end face 2A of the drain electrode 2, but there may be a gap between the high dielectric film 181 and the drain electrode 2. Of the corner portions of the first end second corners 22 and 23, only the corner portion of the first corner 22 may be covered with the high dielectric film 181.

Nineteenth Embodiment

Figure 19:
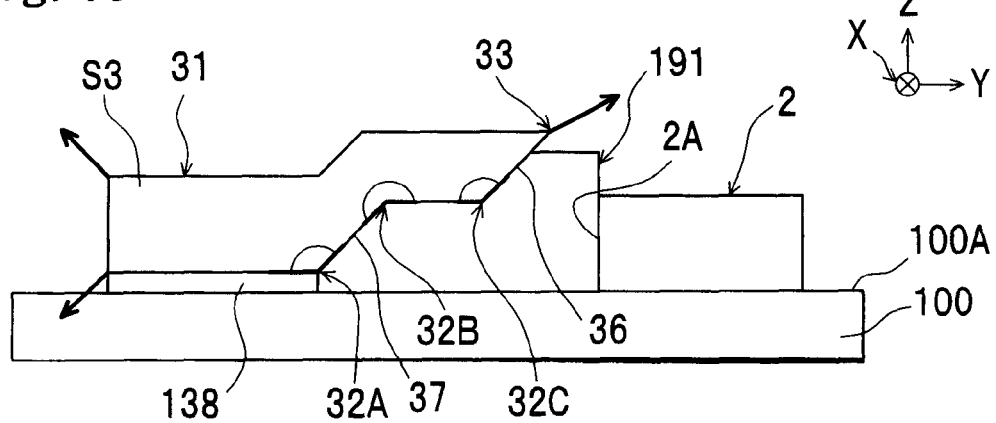
FIG. 19 is a partial cross-sectional view of a field-effect transistor of MIS electrode structure as a nineteenth embodiment of the semiconductor device according to the present invention, showing electrode areas of the transistor.

FIG. 19 shows a partial cross-sectional view of a field-effect transistor of MIS electrode structure as a nineteenth embodiment of the semiconductor device according to the present invention, showing electrode areas of the transistor.

The nineteenth embodiment is a variation of the fifteenth embodiment shown in FIG. 15, and is different from the fifteenth embodiment only in that a high dielectric film 191 made of a material having a higher dielectric constant than the semiconductor layer 100 is formed on the surface 100A of the semiconductor layer 100 between the gate electrode 31 and the drain electrode 2. In the nineteenth embodiment, parts same as or similar to the parts of the fifteenth embodiment are denoted by the same reference numerals or symbols as in the fifteenth embodiment and mainly points different from the fifteenth embodiment will be described.

As shown in FIG. 19, the high dielectric film 191 is formed on the surface 100A of the semiconductor layer 100, and extends in the X-axis direction between the gate electrode 31 and the drain electrode 2. The high dielectric film 191 covers the corner portions including the first corners 32A, 32B, and 32C on the drain electrode 2 side of the polygon S3 consisting of the cross section of the gate electrode 31 and oblique surfaces including the oblique sides 36 and 37 of the polygon S3.

Also, the high dielectric film 191 covers the surface 100A of the semiconductor layer 100 between the gate electrode 31 and the drain electrode 2. Also, the high dielectric film 191 is in contact with and covers the gate electrode 31-side end face 2A of the drain electrode 2.

In the nineteenth embodiment, because the high dielectric film 191 covers the gate electrode 31 over an area ranging from the corner portion of the first corner 32A, through the oblique surface including the oblique side 37 and then the corner portion of the first corner 32B, to the corner portion of the first corner 32C, electric field concentration at the corners 32A, 32B, and 32C on the drain electrode 2 side of the gate electrode 31 is mitigated more, as compared with the thirteenth embodiment, thereby further increasing the breakdown voltage between the electrodes.

In the nineteenth embodiment, the high dielectric film 191 extends until it comes into contact with the end face 2A of the drain electrode 2, but there may be a gap between the high dielectric film 191 and the drain electrode 2. In addition to the corner portions of the first corners 32A, 32B, 32C, the corner portion of the second corner 33 may be covered with the high dielectric film 191.

Twentieth Embodiment

Figure 20:
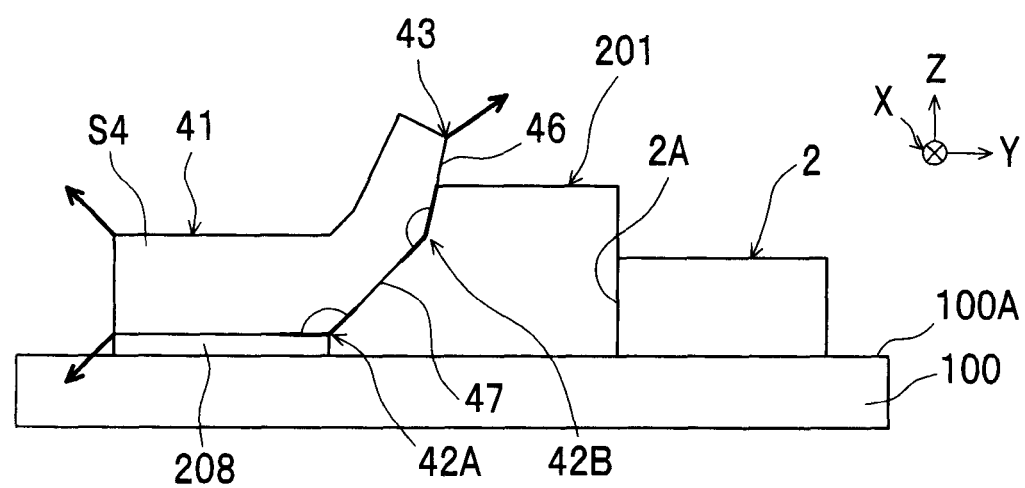
FIG. 20 is a partial cross-sectional view of a field-effect transistor of MIS electrode structure as a twentieth embodiment of the semiconductor device according to the present invention, showing electrode areas of the transistor.

FIG. 20 shows a partial cross-sectional view of a field-effect transistor of MIS electrode structure as a twentieth embodiment of the semiconductor device according to the present invention, showing electrode areas of the transistor.

The twentieth embodiment is a variation of the fourth embodiment shown in FIG. 4. Thus, in the twentieth embodiment, parts same as or similar to the parts of the fourth embodiment are denoted by the same reference numerals or symbols as in the fourth embodiment and mainly points different from the fourth embodiment will be described.

The twentieth embodiment is different from the fourth embodiment in that the gate electrode 41 in FIG. 4 is replaced with a MIS electrode formed above the surface 100A of the semiconductor layer 100 with an insulating film 208 between the gate electrode 41 and the semiconductor layer 100. The insulating film 208 may be a high dielectric film made of a material having a higher dielectric constant than the semiconductor layer 100. According to the twentieth embodiment, a field-effect transistor of MIS electrode structure with an increased breakdown voltage between the electrodes can be realized.

The twentieth embodiment is also different from the fourth embodiment in that a high dielectric film 201 made of a material having a higher dielectric constant than the semiconductor layer 100 is formed on the surface 100A of the semiconductor layer 100 between the gate electrode 41 and the drain electrode 2.

As shown in FIG. 20, the high dielectric film 201 is formed on the surface 100A of the semiconductor layer 100, and extends in the X-axis direction between the gate electrode 41 and the drain electrode 2. The high dielectric film 201 covers the corner portion including the first corner 42A on the drain electrode 2 side of the polygon S4 consisting of a section of the gate electrode 41, the corner portion including the other first corner 42B of the polygon 42B, an oblique surface including the oblique side 47 of the polygon S4, and a part of the oblique surface including the oblique side 46 of the polygon S4.

In the twentieth embodiment, because the high dielectric film 201 covers the gate electrode 41 from the corner portion of the first corner 42A to the corner portion of the other first corner 42B, electric field concentration at the corners 42A and 42B on the drain electrode 2 side of the gate electrode 41 is mitigated more, as compared with the fourth embodiment, thereby further increasing the breakdown voltage between the electrodes.

In the twentieth embodiment, the high dielectric film 201 extends until it comes into contact with the end face 2A of the drain electrode 2, but there may be a gap between the high dielectric film 201 and the drain electrode 2.

Twenty-First Embodiment

Figure 21:
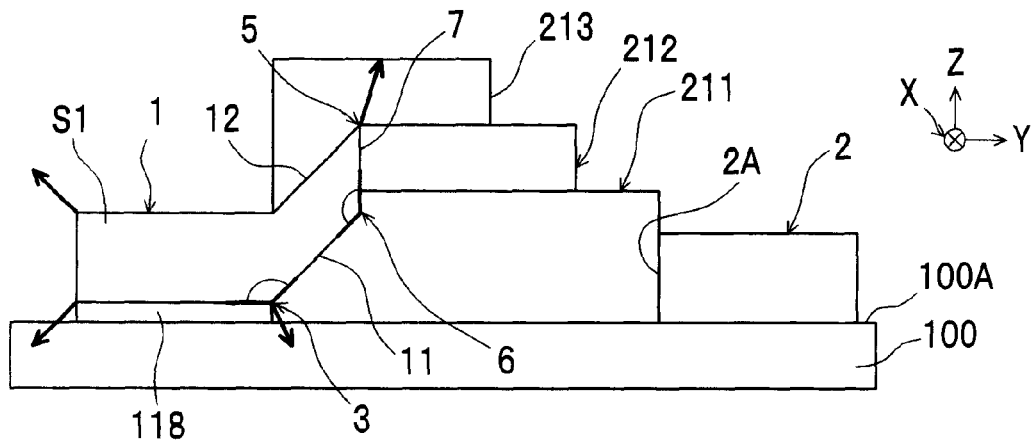
FIG. 21 is a partial cross-sectional view of a field-effect transistor of MIS electrode structure as a twenty-first embodiment of the semiconductor device according to the present invention, showing electrode areas of the transistor.

FIG. 21 shows a partial cross-sectional view of a field-effect transistor of MIS electrode structure as a twenty-first embodiment of the semiconductor device according to the present invention, showing electrode areas of the transistor.

The twenty-first embodiment is a variation of the seventeenth embodiment, and is different from the seventeenth embodiment only in that three high dielectric films 211 to 213 made of materials having higher dielectric constants than the semiconductor layer 100 are provided instead of the high dielectric film 171 in FIG. 17. Therefore, in the twenty-first embodiment, parts same as or similar to the parts of the seventeenth embodiment ere denoted by the same reference numerals or symbols as in the seventeenth embodiment, and mainly points different from the seventeenth embodiment will be described below.

As shown in FIG. 21, the high dielectric film 211 is formed on the surface 100A of the semiconductor layer 100 and extends in the X-axis direction between the gate electrode 1 and the drain electrode 2. The high dielectric film 211 covers a corner portion including the first corner 3 on the drain electrode 2 side of the polygon S1 consisting of the Y-Z section of the gate electrode 1, an oblique surface including the oblique side 11 of the polygon S1, a corner portion including the third corner 6 of the polygon S1, and part of a vertical surface including the vertical side 7 of the polygon S1. The high dielectric film 211 is in contact with and covers the surface 100A of the semiconductor layer 100 between the gate electrode 1 and the drain electrode 2. Also, the high dielectric film 211 is in contact with and covers the gate electrode 2-side end face 2A of the drain electrode 2.

The high dielectric film 212 is formed on the high dielectric film 211 to cover a major part of the vertical surface including the vertical side 7 of the gate electrode 1 and the corner portion including the second corner 5. The high dielectric film 212 is shorter than the high dielectric film 211 in the Y-axis direction, and does not reach the drain electrode 2.

The high dielectric film 213 is formed on the high dielectric film 212 and the oblique side 12, and covers the top of a corner portion including the second corner 5. The top of the corner portion including the second corner 5 is sandwiched between the oblique surface including the oblique side 12 and the vertical surface including the vertical side 7.

In the twenty-first embodiment, the first corner 3, the second corner 5, and the third corner 6 are able to be surely covered with the three high dielectric films 211 to 213.

In the twenty-first embodiment, the three high dielectric films 211 to 213 cover not only the corner portion including the first corner 3 and the corner portion including the third corner 6 but also the corner portion including the second corner 5, so that electric field concentration on the drain electrode 2 side corner portions of the gate electrode 1 can be more suppressed, thereby further increasing the breakdown voltage between the electrodes.

In the twenty-first embodiment, the high dielectric film 211 extends until it comes into contact with the end face 2A of the drain electrode 2, but there may be a gap between the high dielectric film 211 and the drain electrode 2.

Twenty-Second Embodiment

Figure 22:
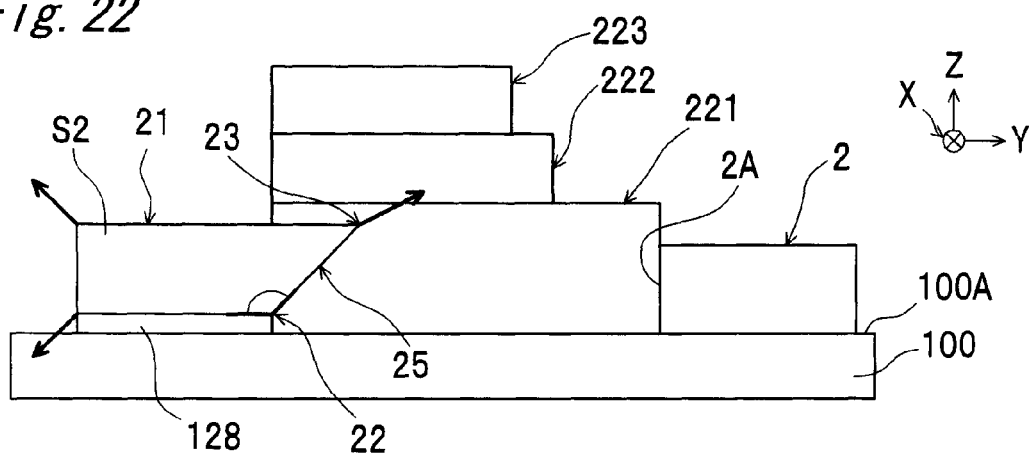
FIG. 22 is a partial cross-sectional view of a field-effect transistor of MIS electrode structure as a twenty-second embodiment of the semiconductor device according to the present invention, showing electrode areas of the transistor.

FIG. 22 shows a partial cross-sectional view of a field-effect transistor of MIS electrode structure as a twenty-second embodiment of the semiconductor device according to the present invention, showing electrode areas of the transistor.

The twenty-second embodiment is a variation of the eighteenth embodiment shown in FIG. 18, and is different from the eighteenth embodiment only in that three high dielectric films 221 to 223 made of materials having higher dielectric constants than the semiconductor layer 100 are provided instead of the high dielectric film 181 in FIG. 18. Therefore, in the twenty-second embodiment, parts same as or similar to the parts of the eighteenth embodiment are denoted by the same reference numerals or symbols as in the eighteenth embodiment, and mainly points different from the eighteenth embodiment will be described.

As shown in FIG. 22, the high dielectric film 221 is formed on the surface 100A of the semiconductor layer 100, and extends in the X-axis direction between the gate electrode 21 and the drain electrode 2. The high dielectric film 221 covers a drain electrode 2 side of the gate electrode 21, namely, a corner portion including the first corner 22 of the polygon S2 consisting of the Y-Z section of the gate electrode 21, an oblique surface including the oblique side 25 of the polygon S2, and a corner portion including the second corner 23 of the polygon S2. The high dielectric film 221 extends in the Y-axis direction between the gate electrode 21 and the drain electrode 2 and is in contact with and covers the surface 100A of the semiconductor layer 100. Also, the high dielectric film 221 is in contact with and covers the gate electrode 21-side end face 2A of the drain electrode 2.

The high dielectric film 222 is formed on the high dielectric film 221, is aligned with the high dielectric film 221 at the gate electrode 21-side end, and is shorter than the high dielectric film 221 in the Y-axis direction. The high dielectric film 223 is formed on the high dielectric film 222, is aligned with the high dielectric film 222 at the gate electrode 21-side end, and is shorter than the high dielectric film 222 in the Y-axis direction.

In the twenty-second embodiment, because the three high dielectric films 221 to 223 cover not only the corner portion including the first corner 22 of the gate electrode 21 but also the corner portion including the second corner 23, electric field concentration on the drain electrode 2 side corner portions of the gate electrode 21 is suppressed, thereby further increasing the breakdown voltage between the electrodes.

In the twenty-second embodiment, the high dielectric film 221 extends until it comes into contact with the end face 2A of the drain electrode 2, but there may be a gap between the high dielectric film 221 and the drain electrode 2.

Twenty-Third Embodiment

Figure 23:
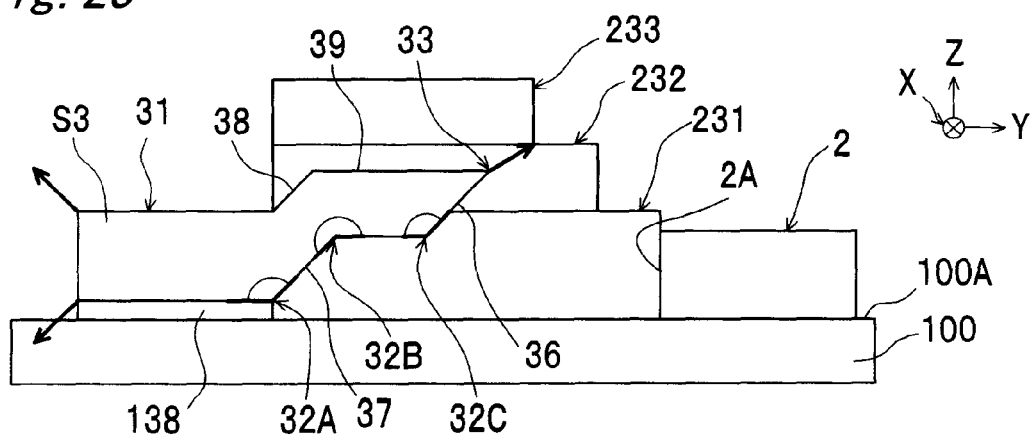
FIG. 23 is a partial cross-sectional view of a field-effect transistor of MIS electrode structure as a twenty-third embodiment of the semiconductor device according to the present invention, showing electrode areas of the transistor.

FIG. 23 shows a partial cross-sectional view of a field-effect transistor of MIS electrode structure as a twenty-third embodiment of the semiconductor device according to the present invention, showing electrode areas of the transistor.

The twenty-third embodiment is a variation of the nineteenth embodiment, and is different from the nineteenth embodiment only in that three high dielectric films 231 to 233 made of materials having higher dielectric constants than the semiconductor layer 100 are provided instead of the high dielectric film 191 in FIG. 19. Therefore, in the twenty-third embodiment, parts same as or similar to the parts of the nineteenth embodiment are denoted by the same reference numerals or symbols as in the nineteenth embodiment, and mainly points different from the nineteenth embodiment will be described.

As shown in FIG. 23, the high dielectric film 231 is formed on the surface 100A of the semiconductor layer 100, and extends in the X-axis direction between the gate electrode 31 and the drain electrode 2. The high dielectric film 231 covers corner portions including the first corners 32A to 32C on the drain electrode 2 side of the polygon S3 which consists of a Y-Z section of the gate electrode 31, an oblique surface including the oblique side 37 of the polygon S3, and a lower part of an oblique surface including the oblique side 36 of the polygon S3. The high dielectric film 231 extends in the Y-axis direction between the gate electrode 31 and the drain electrode 2 and is in contact with and covers the surface 100A of the semiconductor layer 100. Also, the high dielectric film 231 is in contact with and covers the gate electrode 31-side end face 2A of the drain electrode 2.

The high dielectric film 232 is formed on the high dielectric film 231, and covers an upper part of the oblique surface including the oblique side 36, a corner portion including the second corner 33 of the polygon, a top face including a top side 39 of the polygon, and an oblique surface 38 connected to the top face. The high dielectric film 232 is aligned or almost aligned with the high dielectric film 231 on the Y coordinate of its gate electrode 31-side end, that is, the gate electrode 31-side ends of the high dielectric films 231 and 232 are placed on the substantially same Y coordinate, but the high dielectric film 232 is shorter than the high dielectric film 231 in the Y-axis direction.

The high dielectric film 233 is formed on the high dielectric film 232 and is aligned or almost aligned with the high dielectric film 232 on the Y coordinate of the gate electrode 31-side end. The drain electrode 2-side end of the high dielectric film 233 is positioned nearer to the drain electrode 2 than the corner portion including the second corner 33 in the Y-axis direction, but the high dielectric film 233 is shorter than the high dielectric film 232 in the Y-axis direction.

In the twenty-third embodiment, because the three high dielectric films 231 to 233 cover not only the corner portions including the first corners 32A to 32C of the gate electrode 31 but also the corner portion including the second corner 33, electric field concentration on the drain electrode 2 side corner portions of the gate electrode 31 is suppressed, thereby further increasing the breakdown voltage between the electrodes.

In the twenty-third embodiment, the high dielectric film 231 extends until it comes into contact with the end face 2A of the drain electrode 2, but there may be a gap between the high dielectric film 231 and the drain electrode 2.

Twenty-Fourth Embodiment

Figure 24:
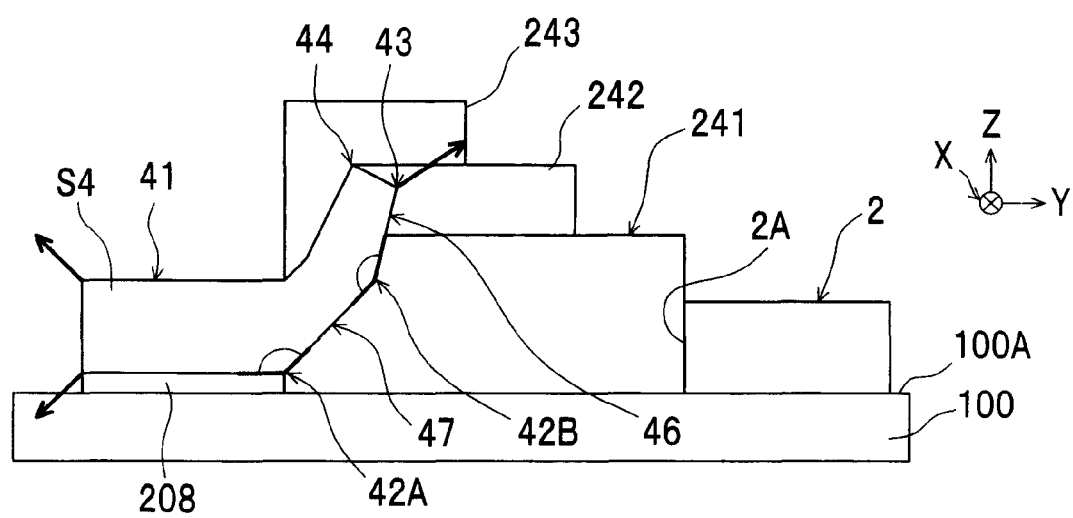
FIG. 24 is a partial cross-sectional view of a field-effect transistor of MIS electrode structure as a twenty-fourth embodiment of the semiconductor device according to the present invention, showing electrode areas of the transistor.

FIG. 24 shows a partial cross-sectional view of a field-effect transistor of MIS electrode structure as a twenty-fourth embodiment of the semiconductor device according to the present invention, showing electrode areas of the transistor.

The twenty-fourth embodiment is a variation of the twentieth embodiment in FIG. 20, and is different from the twentieth embodiment only in that three high dielectric films 241 to 243 made of materials having higher dielectric constants than the semiconductor layer 100 are provided instead of the high dielectric film 201 in FIG. 20. Therefore, in the twenty-fourth embodiment, parts same as or similar to the parts of the twenty-fourth embodiment are denoted by the same reference numerals or symbols as in the twentieth embodiment, and mainly points different from the twentieth embodiment will be described.

As shown in FIG. 24, the high dielectric film 241 is formed on the surface 100A of the semiconductor layer 100, and covers a corner portion including the first corner 42A, an oblique surface including the oblique side 47, a corner portion including the first corner 42B, and a lower half of an oblique surface including the oblique side 46. The high dielectric film 241 covers the surface 100A of the semiconductor layer 100 between the gate electrode 41 and the drain electrode 2. Also, the high dielectric film 241 is in contact with and covers the gate electrode 41-side end face 2A of the drain electrode 2.

The high dielectric film 242 is formed on the high dielectric film 241, and covers an upper half of the oblique surface including the oblique side 46 and a corner portion including a third corner 43 to the top or vertex of a corner portion including a fourth corner 44. The high dielectric film 242 has a dimension in the Y-axis direction that is shorter than the high dielectric film 241, and the drain electrode 2-side end of the high dielectric film 242 does not thus reach the drain electrode 2-side end of the high dielectric film 241.

The high dielectric film 243 is formed on the high dielectric film 242, and covers the corner portion including the fourth corner 43. The drain electrode 2-side end of the high dielectric film 243 does not reach the drain electrode 2-side end of the high dielectric film 242.

In the twenty-fourth embodiment, because the three high dielectric films 241 to 243 cover not only the corner portions including the first corners 42A and 42B of the gate electrode but also the corner portions including the corners 43 and 44, respectively, electric field concentration on the drain electrode 2 side corner portions of the gate electrode 41 is suppressed, thereby increasing the breakdown voltage between the electrodes.

In the twenty-fourth embodiment, the high dielectric film 241 extends until it comes into contact with the end face 2A of the drain electrode 2, but there may be a gap between the high dielectric film 241 and the drain electrode 2.

Twenty-Fifth Embodiment

Figure 25:
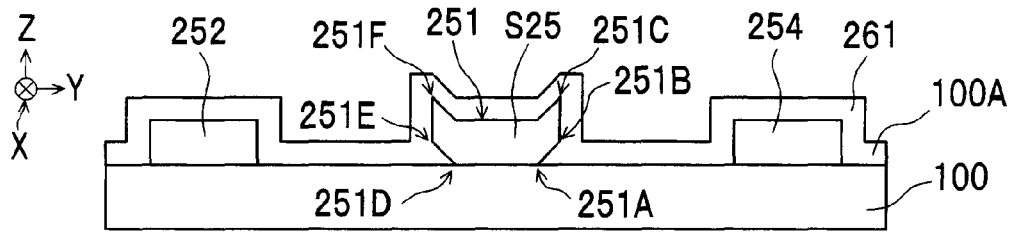
FIG. 25 is a partial cross-sectional view of a Schottky gate field-effect transistor as a twenty-fifth embodiment of the semiconductor device according to the present invention, showing electrode areas of the transistor.

FIG. 25 is a partial cross-sectional view of a Schottky gate field-effect transistor as a twenty-fifth embodiment of the semiconductor device according to the present invention, showing electrode areas of the transistor.

The transistor of the twenty-fifth embodiment includes a gate electrode 251 instead of the gate electrode 1 of the first embodiment in FIG. 1. The gate electrode 251 has a Y-z section in the shape of a polygon S25 whose drain electrode 254 side shape is similar to the drain electrode 2 side shape of the polygon S1 of the gate electrode 1, with its source electrode 252 side shape being similar to the drain electrode 254 side shape.

The twenty-fifth embodiment further has a high dielectric film 261 which covers the gate electrode 251, the drain electrode 254, the source electrode 252, and the surface 100A of the semiconductor layer 100. The high dielectric film 261 is made of a material having a higher dielectric constant than the semiconductor layer 100.

In the field-effect transistor of Schottky electrode structure of the twenty-fifth embodiment, electric fields between the drain electrode 254 and the gate electrode 251 and between the source electrode 252 and the gate electrode 251 are prevented from concentrating at the corners 251A to 251F of the gate electrode 251, so that the breakdown voltage between the drain electrode 254 and the gate electrode 251 and the breakdown voltage between the source electrode 252 and the gate electrode 251 can be increased.

Twenty-Sixth Embodiment

Figure 26:
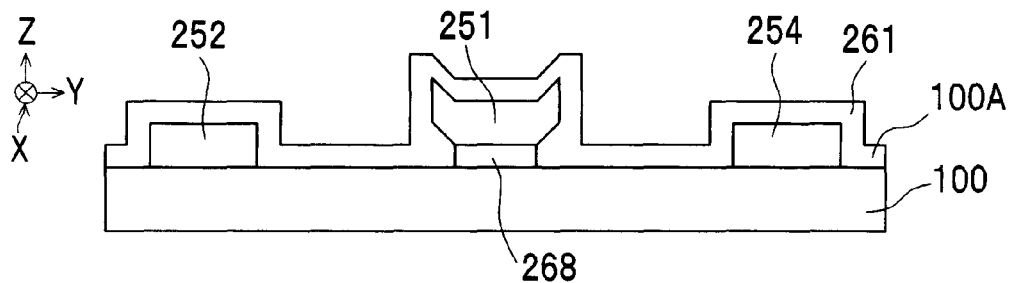
FIG. 26 is a partial cross-sectional view of a field-effect transistor of MIS electrode structure as a twenty-sixth embodiment of the semiconductor device according to the present invention, showing electrode areas of the transistor.

Next, FIG. 26 shows a twenty-sixth embodiment which is a variation of the twenty-fifth embodiment in FIG. 25. The twenty-sixth embodiment is different from the twenty-fifth embodiment only in that an insulating film 268 is formed between the gate electrode 251 in FIG. 25 and the surface 100A of the semiconductor layer 100 in FIG. 25. The insulating film 268 may be a high dielectric film made of a material having a higher dielectric constant than the semiconductor layer 100.

According to the twenty-sixth embodiment, a field-effect transistor of MIS electrode structure with an increased breakdown voltage between the drain electrode 54 and the gate electrode 251 and an increased breakdown voltage between the source electrode 252 and the gate electrode 251 can be realized.

Twenty-Seventh Embodiment

Figure 27:
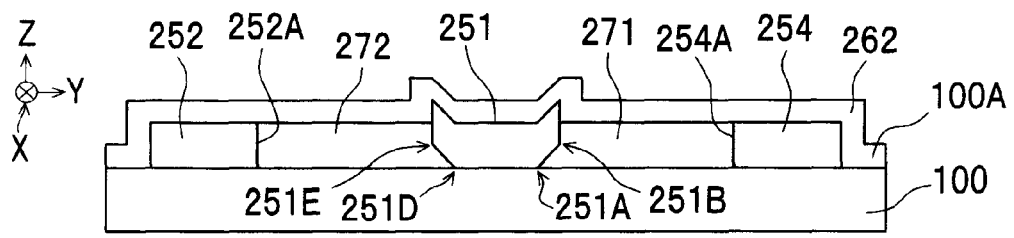
FIG. 27 is a partial cross-sectional view of a Schottky gate field-effect transistor as a twenty-seventh embodiment of the semiconductor device according to the present invention, showing electrode areas of the transistor.

FIG. 27 shows a twenty-seventh embodiment which is a variation of the twenty-fifth embodiment in FIG. 25.

In the twenty-seventh embodiment, a high dielectric layer 271 made of a material having a higher dielectric constant than the semiconductor layer 100 is formed between the gate electrode 251 and the drain electrode 254. The high dielectric layer 271 is formed on the surface 100A of the semiconductor layer 100, and covers the corners 251A and 251B on the drain electrode 254 side of the gate electrode 251. The high dielectric layer 271 extends in the Y-axis direction and covers an end face 254A of the drain electrode 254, too.

On the other hand, a high dielectric layer 272 made of a material having a higher dielectric constant than the semiconductor layer 100 is formed between the gate electrode 251 and the source electrode 252. The high dielectric layer 272 is formed on the surface 100A of the semiconductor layer 100, and covers the corners 251D and 251E on the source electrode 252 side of the gate electrode 251. The high dielectric layer 272 extends in the Y-axis direction, and also covers an end face 252A of the source electrode 252.

Furthermore, a high dielectric film 262 made of a material having a higher dielectric constant than the semiconductor layer 100 covers the source electrode 252, the high dielectric layer 272, the gate electrode 251, the high dielectric layer 271, and the drain electrode 254.

In the field-effect transistor of Schottky electrode structure of the twenty-seventh embodiment, the high dielectric layers 271 and 272 cover the corners 251A, 251B, 252D, and 251E, thereby increasing the breakdown voltage between electrodes more than in the twenty-fifth embodiment.

Twenty-Eighth Embodiment

Figure 28:
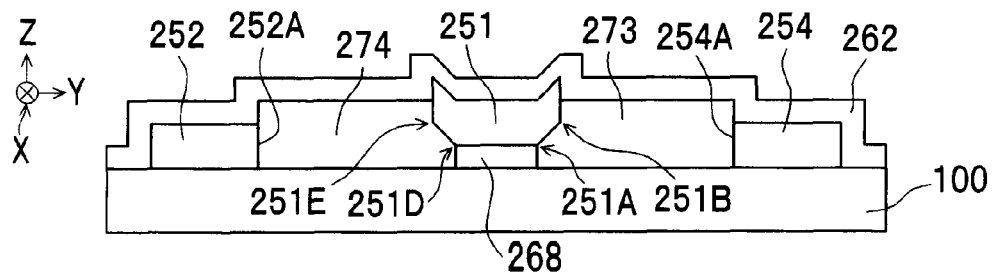
FIG. 28 is a partial cross-sectional view of a field-effect transistor of MIS electrode structure as a twenty-eighth embodiment of the semiconductor device according to the present invention, showing electrode areas of the transistor.

Next, FIG. 28 shows a twenty-eighth embodiment which is a variation of the twenty-sixth embodiment in FIG. 26.

In the twenty-eighth embodiment, a high dielectric layer 273 made of a material having a higher dielectric constant than the semiconductor layer 100 is formed between the gate electrode and insulating film 251 and 268 and the drain electrode 254. The high dielectric layer 273 is formed on the surface 100A of the semiconductor layer 100, and covers the corners 251A and 251B on the drain electrode 254 side of the gate electrode 251. The high dielectric layer 273 extends in the Y-axis direction, and also covers an end face 254A of the drain electrode 254.

On the other hand, a high dielectric layer 274 made of a material having a higher dielectric constant than the semiconductor layer 100 is formed between the gate electrode 251 and the source electrode 252. The high dielectric layer 274 is formed on the surface 100A of the semiconductor layer 100, and covers corners 251D and 251E on the source electrode 252 side of the gate electrode 251. The high dielectric layer 274 extends in the Y-axis direction, and also covers an end face 252A of the drain electrode 252.

Furthermore, a high dielectric film 262 made of a material having a higher dielectric constant than the semiconductor layer 100 covers the source electrode 252, the high dielectric layer 274, the gate electrode 251, the high dielectric layer 273, and the drain electrode 254.

In the field-effect transistor of MIS electrode structure of the twenty-eighth embodiment, the high dielectric layers 273 and 274 cover the corners 251A, 251B, 252D, and 251E, thereby increasing the breakdown voltage between the electrodes more than the twenty-sixth embodiment.

In each of the embodiments described above, the gate electrode may be a metal electrode formed of, for example, a WN/Au film, a Ti/Pt/Au film of which Pt is a main constituent, or a Ti/Au film. The drain electrode and the source electrode may be metal electrodes formed by a laminated film of Ti/Al/Au as an example. The semiconductor layer 100 may be a III-V semiconductor layer such as a GaAs layer, an AlGaAs layer, a GaN layer, an AlGaN layer, a SiC layer, or the like. Also, each of the high dielectric films may be, for example, a metal oxide film including at least one element selected from a group consisting of Hf, Ti, Nb, Ta, Zr, La, Y, Ba, Sr, and Mg; a SiNx film; or the like.

Furthermore, in each of the embodiments described above, the field-effect transistor (FET) may be of GaN-based semiconductors, GaAs-based semiconductors, or other semiconductors. Each of the embodiments described above is effective in particular when the transistor is a GaN-based heterojunction field-effect transistor for which a high gate breakdown voltage is particularly required.

In each of the first to twenty-fourth embodiments, the polygon of the Y-Z section of the gate electrode has two corners on the source electrode (not shown) side, and the interior angles of the two corners are substantially right angles. However, the source electrode (not shown) side shape of the polygon of the Y-z section of the gate electrode may be similar to the drain electrode side shape of the polygon.

Furthermore, in each of the embodiments described above, description is made on the case that the semiconductor device is a field-effect transistor. However, this invention may also be applied to any other semiconductor device in which a Schottky electrode and an ohmic electrode are formed on a semiconductor layer, such as an insulated gate bipolar transistor (IGBT), a thyristor, or the like.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
a semiconductor layer;
a non-ohmic first electrode formed on the semiconductor layer; and
an ohmic second electrode formed on the semiconductor layer apart from the first electrode,
wherein the second electrode has a linear edge that faces the first electrode and is in contact with the semiconductor layer and, the linear edge of the second electrode extends in an X-axis direction, a direction of thickness of the semiconductor layer extends in a Z-axis direction and is orthogonal to the X-axis direction, and a direction orthogonal to the Z-axis and X-axis directions is a Y-axis direction,
a section of the entire first electrode taken along a plane extending in the Y-axis direction and the Z-axis direction has a shape of a polygon, and a first corner of the first electrode polygon adjacent the second electrode is at the semiconductor layer and said first corner of said first electrode comprises converging first and second linear edges,
wherein the first linear edge extends parallel to the Y-axis direction and the first corner of the first electrode has an obtuse interior angle of which an outward extension line of a bisector crosses the semiconductor layer and the first electrode has a second corner and a third corner, the third corner between the first corner and the second corner and the third corner has an obtuse interior angle of which an outward extension line of a bisector crosses the semiconductor layer.

2. A semiconductor device as claimed in claim 1, wherein the first electrode is a Schottky electrode or a MIS electrode.

3. A semiconductor device as claimed in claim 1, wherein the semiconductor device is a field-effect transistor in which the first electrode is a gate electrode and the second electrode is a source electrode or a drain electrode.

4. A semiconductor device as claimed in claim 3, wherein the semiconductor device is a GaN-based heterojunction field-effect transistor.

5. A semiconductor device as claimed in claim 1, wherein the interior angle of the second corner of the first electrode includes an angle of about 45 degrees and the interior angle of the third corner includes an angle of about between 120 and 150 degrees.

6. A semiconductor device as claimed in claim 1, wherein an outward extension line of a bisector of the second corner extends away from the semiconductor layer.

7. A semiconductor device, comprising:
a semiconductor layer;

a non-ohmic first electrode formed on the semiconductor layer; and an ohmic second electrode formed on the semiconductor layer apart from the first electrode, wherein an area sandwiched between a base side surface which is a second electrode-side side surface of the first electrode and is in contact with a top surface of the semiconductor layer, and an entire surface of the semiconductor layer opposed to the base side surface, splays out at a flat planar slope from the first electrode toward the second electrode at an oblique angle beginning at a contact at a first corner of the second electrode-side side surface of the first electrode with the top surface of the semiconductor layer, and wherein a substantially vertical side of the non-ohmic first electrode extends substantially perpendicular to the surface of the semiconductor layer and the flat planar slope extends from the first corner to a second corner and includes a third corner between the first corner and second corner, and interior angles of the first corner and the third corner are obtuse angles.

8. A semiconductor device as claimed in claim 7, wherein an interior angle of the second corner of the first electrode includes an angle of about 45 degrees and the interior angle of the third corner includes an angle of about between 120 and 150 degrees.

9. A semiconductor device as claimed in claim 7, wherein an outward extension line of a bisector of the second corner extends away from the semiconductor layer.

10. A semiconductor device, comprising:
a semiconductor layer;
a non-ohmic first electrode formed on the semiconductor layer; and
an ohmic second electrode formed on the semiconductor layer apart from the first electrode, wherein the second electrode has a linear edge which faces the first electrode and is in contact with the semiconductor layer and the linear edge of the second electrode extends in an X-axis direction, a direction of thickness of the semiconductor layer extends in a Z-axis direction and is orthogonal to the X-axis direction, and a Y-axis direction is orthogonal to the X-axis direction and the Z-axis direction, an entire section of the semiconductor device taken along a plane extending in the Y-axis direction and the Z-axis direction has:

a first corner of the first electrode which faces the second electrode and is at the semiconductor layer and has an interior angle larger than 90°; and an area sandwiched between a second electrode-side facing side of the first electrode and an upper edge of the semiconductor layer, said area including:

a splaying first portion splaying out in a flat plane of an outer surface of the second electrode-side facing side of the first electrode from the first electrode toward the second electrode; and a second portion which extends from the first portion away from the semiconductor layer in a flat plane of an outer surface of the second electrode-side facing side of the first electrode and has either a constant dimension in the Y-axis direction or a splaying portion splaying from the first portion at an obtuse interior angle.

11. A semiconductor device as claimed in claim 10, wherein the splaying first portion of the first electrode first portion and second portion end in a second corner comprising an acute interior angle and an outward extension line of the acute interior angle extends away from the semiconductor layer.

\* \* \* \* \*